United States Patent
Sano et al.

(10) Patent No.: US 7,612,498 B2
(45) Date of Patent: Nov. 3, 2009

(54) DISPLAY ELEMENT, OPTICAL DEVICE, AND OPTICAL DEVICE MANUFACTURING METHOD

(75) Inventors: Hiroshi Sano, Ishikawa-ken (JP); Shirou Sumita, Ishikawa-ken (JP); Tatsuo Yoshioka, Toyooka (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 528 days.

(21) Appl. No.: 10/995,231

(22) Filed: Nov. 24, 2004

(65) Prior Publication Data

US 2005/0156513 A1 Jul. 21, 2005

(30) Foreign Application Priority Data

Nov. 27, 2003 (JP) ............................. 2003-398084
Jun. 10, 2004 (JP) ............................. 2004-172450

(51) Int. Cl.
*H01J 1/62* (2006.01)
*H05B 33/00* (2006.01)
*H01L 35/24* (2006.01)

(52) U.S. Cl. ...................... 313/506; 313/507; 313/512; 438/40

(58) Field of Classification Search ................. 313/500; 257/60; 438/57
See application file for complete search history.

(56) References Cited

U.S. PATENT DOCUMENTS 4,995,043 A * 2/1991 Kuwata et al. ................. 372/7

| | | | |
|---|---|---|---|
| 6,649,433 B2 * | 11/2003 | Mikhael et al. | 438/22 |
| 6,866,901 B2 * | 3/2005 | Burrows et al. | 428/1.5 |
| 2002/0047514 A1 * | 4/2002 | Sakurai et al. | 313/503 |
| 2002/0063515 A1 * | 5/2002 | Goto | 313/500 |
| 2002/0130363 A1 * | 9/2002 | Yamazaki et al. | 257/353 |
| 2002/0130616 A1 * | 9/2002 | Shirakawa et al. | 313/509 |
| 2002/0140347 A1 * | 10/2002 | Weaver | 313/506 |
| 2003/0205845 A1 * | 11/2003 | Pichler et al. | 264/272.11 |

(Continued)

FOREIGN PATENT DOCUMENTS

JP 2003-217829 7/2003

OTHER PUBLICATIONS

Yuji Yanagi, "Meeting Demand of Mass Production of Thin and large-sized Flexible Substrate", Flat Panel Display 2003 of Nikkei BP Inc., Dec. 27, 2002, pp. 264-270.

*Primary Examiner*—Sikha Roy
*Assistant Examiner*—Tracie Green
(74) *Attorney, Agent, or Firm*—Oblon, Spivak, McClelland, Maier & Neustadt, L.L.P.

(57) ABSTRACT

An array substrate includes an almost rectangular effective portion which is formed on the major surface of the substrate and includes a plurality of pixels for displaying images. An organic EL display device includes a sealer which is placed to cover at least the effective portion on the major surface of the array substrate. The sealer has a structure in which at least two almost rectangular buffer layers which have substantially the same pattern and barrier layers each of which is a pattern larger than each buffer layer and covers each buffer layer to shield it from the open air are stacked on each other. The shortest distance from one side of an end of the effective portion to one side of an end of the first buffer layer is different from the shortest distance to one side of an end of the second buffer layer.

5 Claims, 16 Drawing Sheets

U.S. PATENT DOCUMENTS

2003/0235935 A1* 12/2003 Yamazaki et al. ............. 438/89
2005/0017633 A1* 1/2005 Miyadera .................... 313/512
2007/0054051 A1* 3/2007 Arai et al. ................ 427/248.1

* cited by examiner

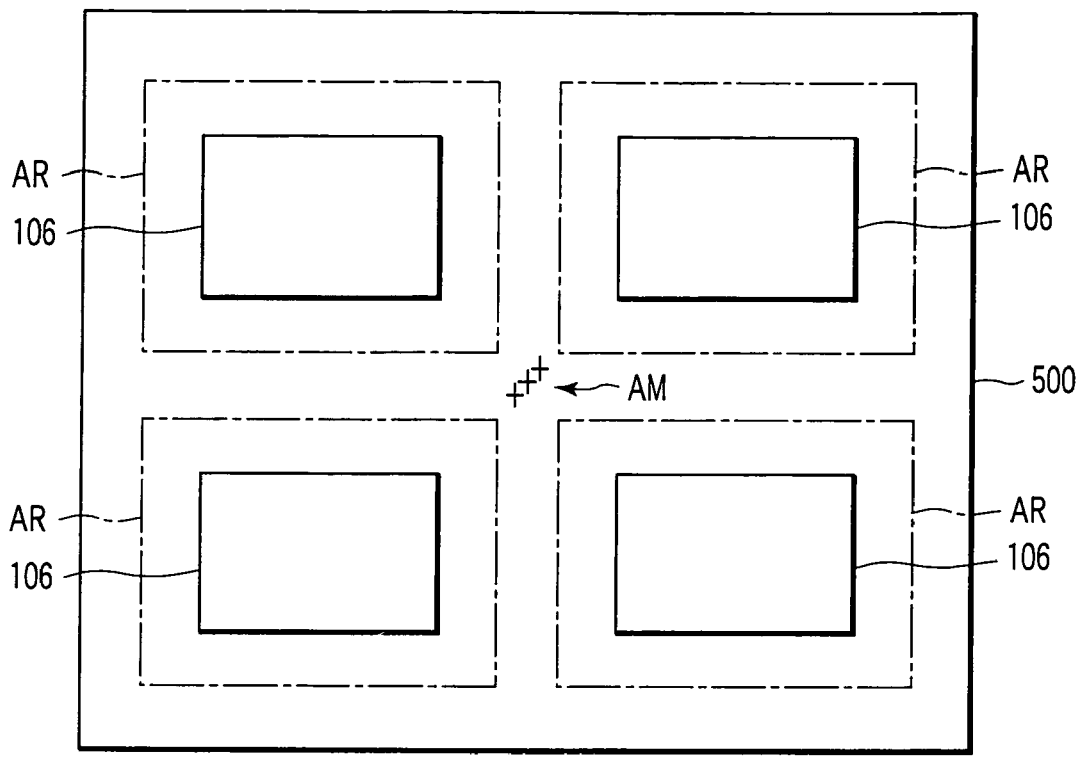
F I G. 4A
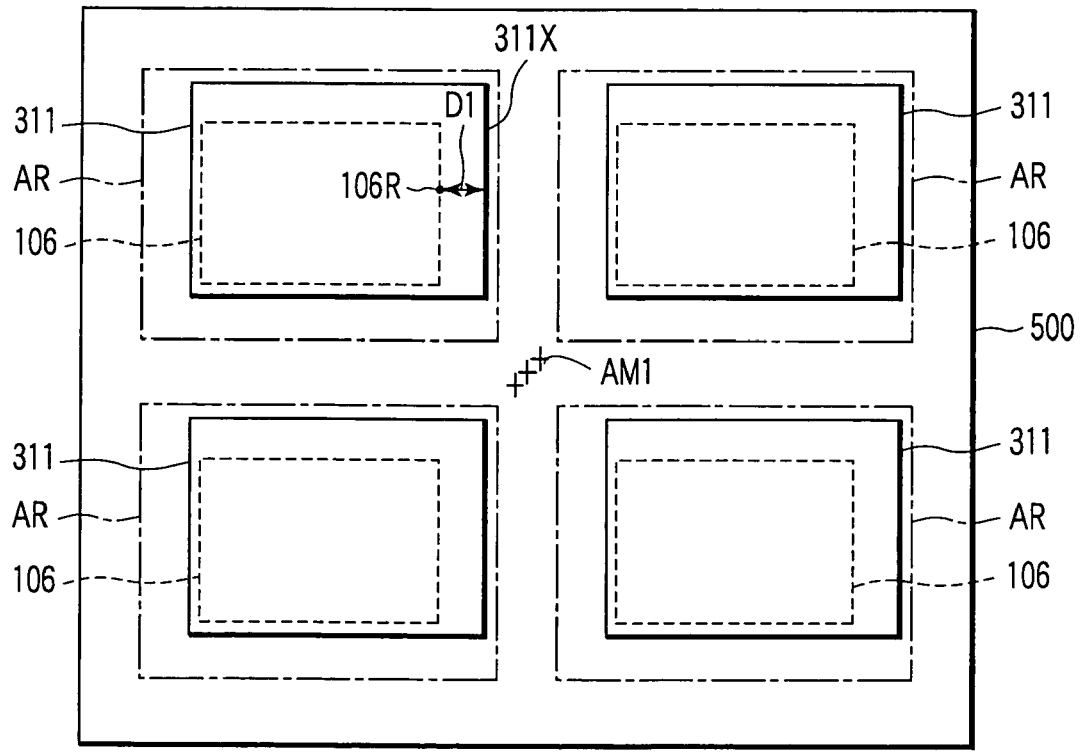
F I G. 4B

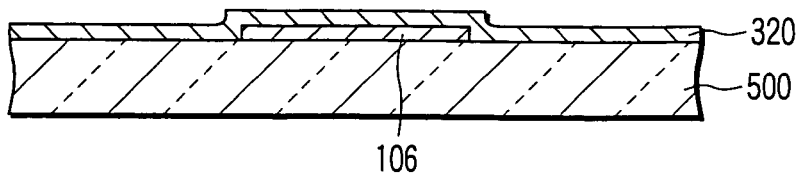
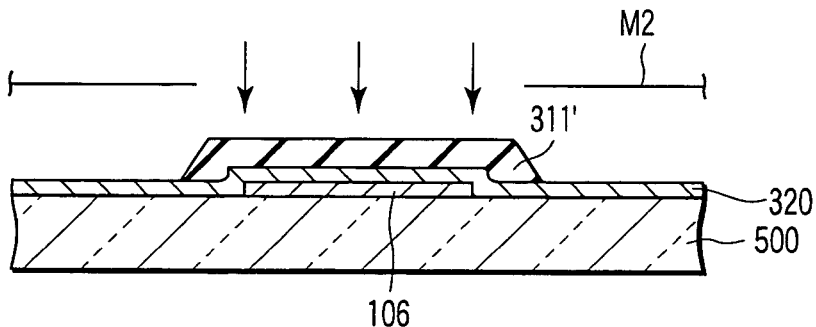
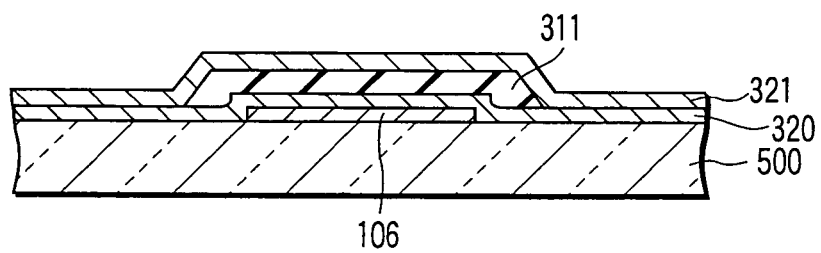
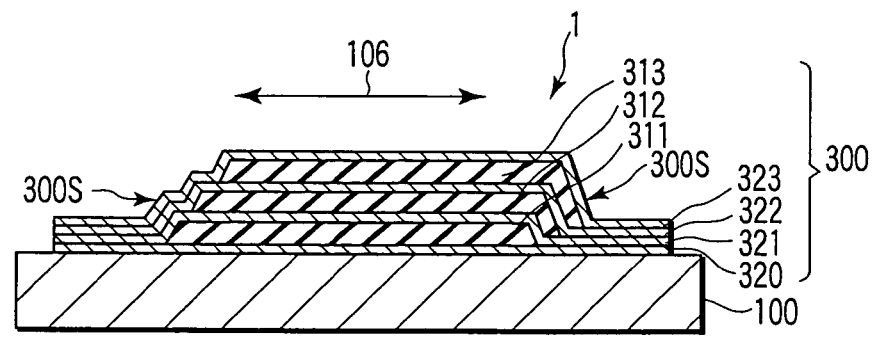
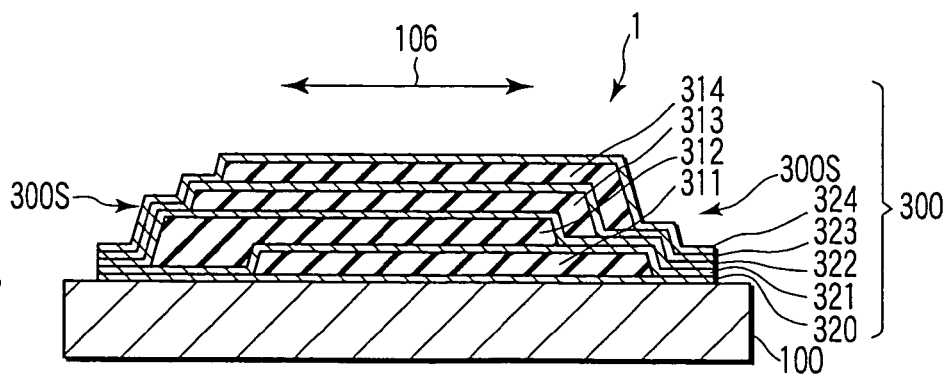

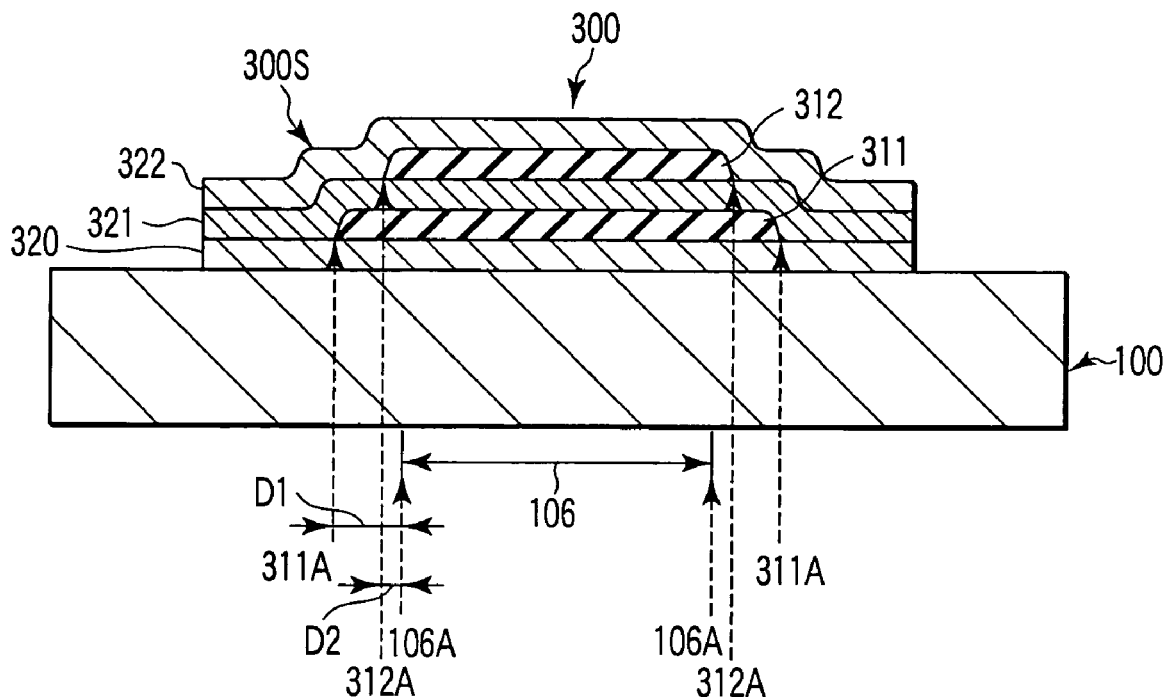
F I G. 11A
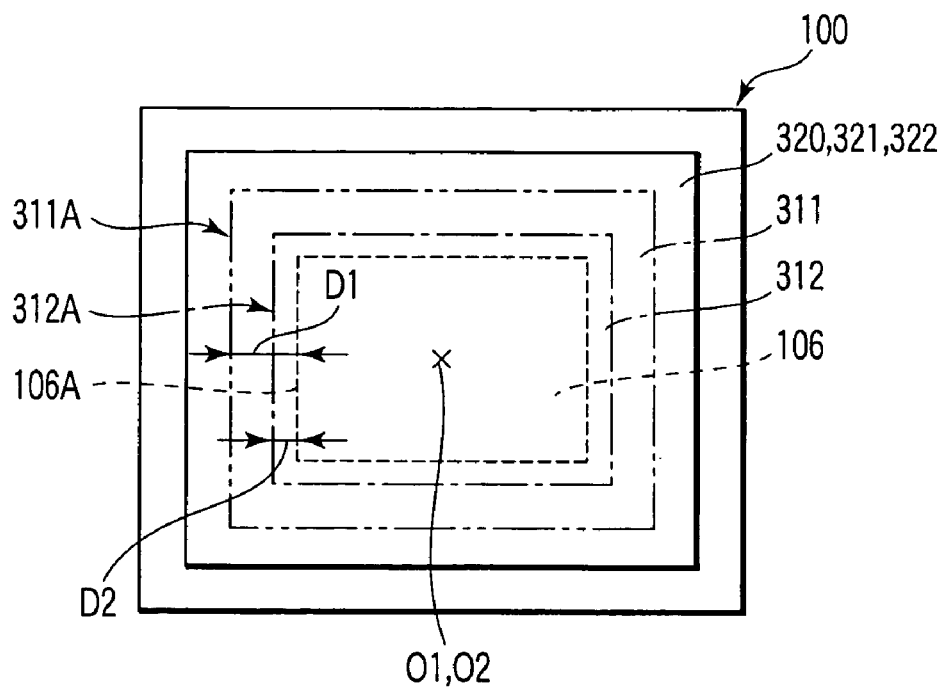
F I G. 11B

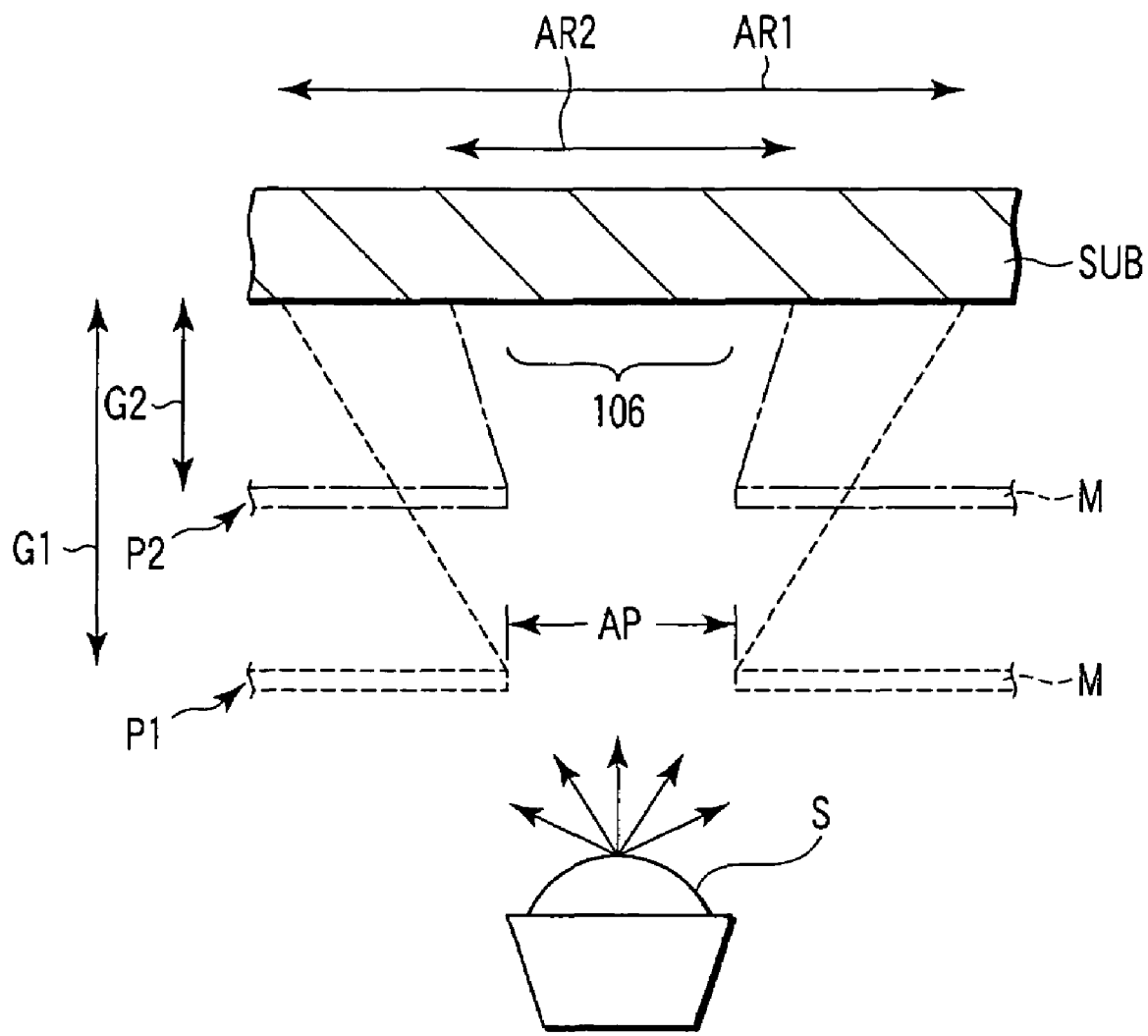
F I G. 15

DISPLAY ELEMENT, OPTICAL DEVICE, AND OPTICAL DEVICE MANUFACTURING METHOD

CROSS-REFERENCE TO RELATED APPLICATIONS

This application is based upon and claims the benefit of priority from prior Japanese Patent Applications No. 2003-398084, filed Nov. 27, 2003; and No. 2004-172450, filed Jun. 10, 2004, the entire contents of both of which are incorporated herein by reference.

BACKGROUND OF THE INVENTION

1. Field of the Invention

The present invention relates to a display elements an optical device, and an optical device manufacturing method and, more particularly, to an optical device including a plurality of display elements such as self-luminous elements and a method of manufacturing the same.

2. Description of the Related Art

An organic electroluminescence (EL) display device has recently attracted attention as a flat display device. This organic EL display device is a display device including self-luminous elements, and hence has a wide viewing angle and requires no backlight. This makes it possible to realize a flat display device, suppress power consumption, and achieve high response speed.

Owing to these characteristics, an organic EL display device has attracted attention as a promising candidate of a next-generation flat display device replacing a liquid crystal display device. Such an organic EL display device includes an array substrate formed by arranging organic EL elements as self-luminous elements in the form of a matrix. Each organic EL element has a structure in which an organic active layer containing an organic compound having a luminous function is sandwiched between an anode and a cathode.

The organic EL element quickly deteriorates in luminous characteristics when it is exposed to moisture and oxygen contained in the open air. For this reason, there have been proposed various techniques of shielding and sealing the major surface of an array substrate, on which organic EL elements are arranged, against the open air. For example, there has been disclosed a film sealing technique of stacking organic and inorganic films on the electrode placed on the upper surface side of each organic EL element (see e.g., non-patent reference: Yuji Yanagi, "For Mass Production of Low-Profile, Large-Size Flexible Boards", Flat Panel Display 2003, Nikkei B P, Dec. 27, 2002, pp. 264-270).

In order to seal each organic EL element, it is required to form a film which has good step coverage characteristics and is free from defects such as pinholes and cracks. It is difficult in practice to obtain a perfectly defect-free film. For this reason, each organic EL element cannot be completely shielded from the open air, and it is difficult to maintain sufficient performance for a long period of time.

BRIEF SUMMARY OF THE INVENTION

The present invention has been made in consideration of the above problem, and has as its object to provide a display element which has excellent sealing characteristics and can maintain good display performance, an optical device, and an optical device manufacturing method.

According to a first aspect of the present invention, there is provided an optical device comprising: a substantially rectangular effective portion which is formed on a major surface of a substrate and comprises a plurality of pixels to display an image; and a sealer which is placed over the substrate to cover at least the effective portion of the major surface of the substrate, wherein the sealer includes at least two buffer layers having substantially identical patterns and barrier layers each of which is a pattern larger than the buffer layer and covers a corresponding one of the buffer layers are stacked on each other, with a shortest distance from one side of an end of the effective portion to one side of an end of a first buffer layer being different from a shortest distance to one side of an end of a second buffer layer.

According to a second aspect of the present invention, there is provided a method for manufacturing an optical device, comprising; forming, on a major surface of a substrate, a substantially rectangular effective portion comprising a plurality of pixels to display an image, and placing a sealer to cover at least the effective portion of the major surface of the substrate, wherein a manufacturing process for the sealer including: forming a substantially rectangular first buffer layer which is a pattern larger than at least the effective portion; forming a first barrier layer which is a pattern larger than the first buffer layer and covers the first buffer layer; forming, on the first barrier layer, a second buffer layer which is substantially the same pattern as the first buffer layer; and forming a second barrier layer which is a pattern larger than the second buffer layer and covers the second buffer layer, and a shortest distance from one side of an end of the effective portion to one side of an end of the first buffer layer is different from a shortest distance to one side of an end of the second buffer layer.

According to a third aspect of the present invention, there is provided an optical display element, comprising a display element formed on a major surface of a substrate, a sealer which is placed over the substrate to cover the display element and having at least two buffer layers and barrier layers each of which is a pattern larger than the buffer layer and covers a corresponding one of the buffer layers are stacked on each other, wherein a first buffer layer has a pattern different in size from a second buffer layer placed thereabove, and the second buffer layer is stacked on the first buffer layer such that an outer peripheral portion of the second buffer layer is located inside or outside an outer peripheral portion of the first buffer layer within the major surface of the substrate.

According to a fourth aspect of the present invention, there is provided an optical device comprising: an effective portion which is formed on a major surface of a substrate and comprises a plurality of display elements; and a sealer which is placed to cover at least the effective portion of the major surface of the substrate, the sealer having a structure in which at least two buffer layers and barrier layers each of which is a pattern larger than the buffer layer and covers a corresponding one of the buffer layers are stacked on each other, wherein a first buffer layer has a pattern different in size from a second buffer layer placed thereabove, and the second buffer layer is stacked on the first buffer layer such that an outer peripheral portion of the second buffer layer is located inside or outside an outer peripheral portion of the first buffer layer within the major surface of the substrate.

According to a fifth aspect of the present invention, there is provided a method for manufacturing an optical device comprising: forming, on a major surface of a substrate, an effective portion comprising a plurality of pixels, and placing a sealer to cover at least the effective portion of the major surface of the substrate, wherein a manufacturing process for the sealer includes: forming a first buffer layer in correspondence with the effective portion; forming a barrier layer which is a pattern larger than the first buffer layer and covers the first buffer layer; and forming a second buffer layer on the barrier layer in correspondence with the effective portion, the forming the first buffer layer and the second buffer layer include film formation processes of forming resin material films through a mask with the same pattern, and alignment is performed in the respective processes such that a gap from the major surface of the substrate to the mask is made to vary, the first buffer layer is formed to have a pattern different in size from the second buffer layer, and the second buffer layer is stacked on the first buffer layer such that an outer peripheral portion of the second buffer layer is located inside or outside an outer peripheral portion of the first buffer layer.

According to a sixth aspect of the present invention, there is provided a method for manufacturing an optical device comprising: forming, on a major surface of a substrate, an effective portion comprising a plurality of pixels, and placing a sealer to cover at least the effective portion of the major surface of the substrate, wherein a manufacturing process for the sealer includes: mounting a barrier layer mask on the major surface of the substrate on which the effective portion is formed; forming, through the barrier layer mask, a first barrier layer which covers at least the effective portion; forming a first buffer layer on the first barrier layer in correspondence with the effective portion; forming, through the barrier layer mask, a second barrier layer which is a pattern larger than the first buffer layer and covers the first buffer layer; forming a second buffer layer on the second barrier layer in correspondence with the effective portion; and forming, through the barrier layer mask, a third barrier layer which is a pattern larger than the second buffer layer and covers the second buffer layer, wherein the forming the first buffer layer and the second buffer layer include film formation processes of forming resin material films through a mask with the same pattern, and alignment is performed in the respective film formation processes such that a gap from the major surface of the substrate to the mask is made to vary, the first buffer layer is formed to have a pattern different in size from the second buffer layer, and the second buffer layer is stacked on the first buffer layer such that the outer peripheral portion of the second buffer layer is located inside or outside the outer peripheral portion of the first buffer layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4A is a plan view for explaining a method of manufacturing an organic EL display device according to the first embodiment;

FIG. 4B is a plan view for explaining the method of manufacturing the organic EL display device according to the first embodiment;

FIG. 5A is a view for explaining a manufacturing process for the formation of a barrier layer of a sealer;

FIG. 5B is a view for explaining a manufacturing process for the formation of a buffer layer of the sealer;

FIG. 5C is a view for explaining a manufacturing process for the formation of a barrier layer of the sealer;

FIG. 6 is a view schematically showing a cross-sectional structure of an organic EL display device manufactured in the first and third embodiments;

FIG. 7 is a view schematically showing a cross-sectional structure of an organic EL display device manufactured in the second embodiment;

FIG. 11A is a view schematically showing a cross-sectional structure of the sealer when the array substrate shown in FIG. 3 is cut along a line A-B;

FIG. 11B is a view schematically showing a two-dimensional structure of the array substrate and sealer shown in FIG. 11A;

FIG. 15 is a view schematically showing the arrangement of the second chamber in the manufacturing apparatus shown in FIG. 14.

DETAILED DESCRIPTION OF THE INVENTION

A display element, an optical device, and an optical device manufacturing method according to an embodiment of the present invention will be described below with reference to the views of the accompanying drawing. Note that this embodiment will exemplify a self-luminous display device, e.g., an organic EL (electroluminescence) display device as an optical device.

Figure 1:
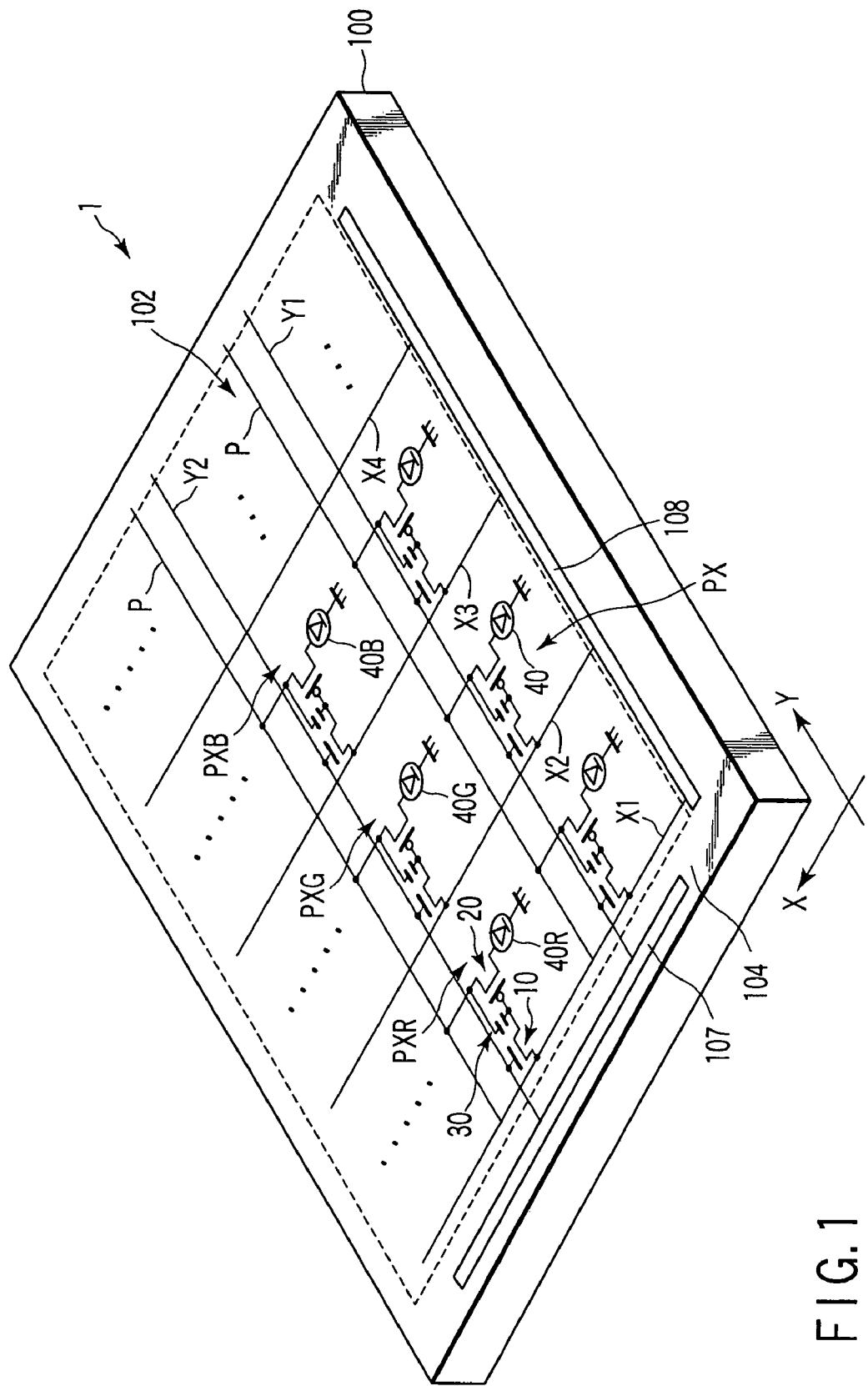
FIG. 1 is a view schematically showing the arrangement of the array substrate of an organic EL display device according to an embodiment of the present invention.
Figure 2:
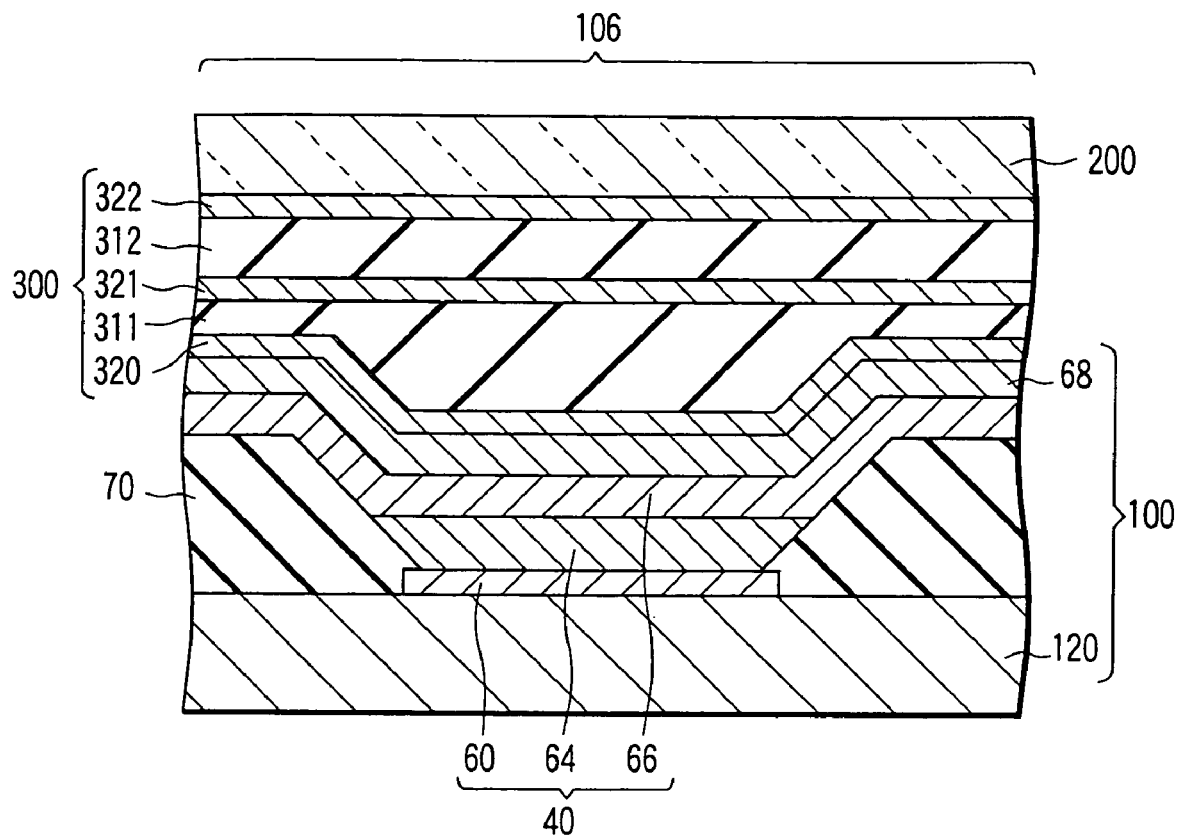
FIG. 2 is a sectional view schematically showing the structure of one pixel portion of the organic EL display device shown in FIG. 1.

As shown in FIGS. 1 and 2, an organic EL display device 1 is comprised of an array substrate 100 having a display area 102 which displays an image, and a sealer 300 which seals at least the display area 102 of the array substrate 100. The display area 102 of the array substrate 100 is comprised of a plurality of pixels PX (R, G, B) arranged in the form of a matrix.

Each pixel PX (R, G, B) includes a pixel switch 10 having a function of electrically selecting an ON state or an off state, a drive transistor 20 which supplies a desired driving current to the display element on the basis of the video signal supplied through the pixel switch 10, and a storage capacitor element 30 which holds the gate-source potential of the drive transistor 20 for a predetermined period in accordance with the video signal. The pixel switch 10 and drive transistor 20 are formed from, for example, thin-film transistors. In this case, polysilicon is used for the semiconductor layers of these transistors.

Each pixel PX (R, G, B) also includes an organic EL element 40 (R, G, B) as a part of a display element. That is, a red pixel PXR includes an organic EL element 40R which emits red light. A green pixel PXG includes an organic EL element 40G which emits green light. A blue pixel PXB includes an organic EL element 40B which emits blue light.

Each organic EL element 40 (R, G, B) basically has the same arrangement. Each organic EL element 40 is comprised of a first electrode 60 formed in an isolated island shape for each of pixels PX arranged in the form of a matrix, a second electrode 66 formed commonly for all the pixels PX so as to face the first electrode 60, and an organic active layer 64 held between the first electrode 60 and the second electrode 66.

The array substrate 100 includes a plurality of scanning lines Ym (m=1, 2, ...) arranged along the row direction of the pixels PX (i.e., the Y direction in FIG. 1), a plurality of signal lines Xn (n=1, 2, ...) arranged along a direction almost perpendicular to the scanning lines Ym (i.e., the X direction in FIG. 1), and power supply lines P for supplying power to the first electrode 60 side of the organic EL elements 40.

The power supply lines P are connected to the first electrode power supply line (not shown) placed around the display area 102. The second electrode 66 side of each organic EL element 40 is connected to the second electrode power supply line (not shown) which is placed around the display area 102 and supplies a common potential (ground potential in this case).

The array substrate 100 also includes, in a peripheral area 104 along the outer periphery of the display area 102 at least part of a scanning line driving circuit 107 which supplies scanning signals to the respective scanning lines Ym, and at least part of a signal line driving circuit 108 which supplies video signals to the respective signal lines Xn. All the scanning lines Ym are connected to the scanning line driving circuit 107. All the signal lines Xn are connected to the signal line driving circuit 108.

In this case, the pixel switch 10 is placed near the intersection between the scanning line Ym and the signal line Xn. The gate electrode of the pixel switch 10 is connected to the scanning line Ym, and the source electrode is connected to the signal line Xn. The drain electrode of the pixel switch 10 is connected to one of electrodes constituting the storage capacitor element 30 and the gate electrode of the drive transistor 20. The source electrode of the drive transistor 20 is connected to the other electrode of the storage capacitor element 30 and the power supply line P, and the drain electrode is connected to the first electrode 60 of the organic EL element 40.

As shown in FIG. 2, the array substrate 100 includes display elements, i.e., the organic EL elements 40, arranged on a wiring board 120. Note that the wiring board 120 is formed by arranging the pixel switches 10, the drive transistors 20, the storage capacitor elements 30, the scanning line driving circuit 107, the signal line driving circuit 108, and various interconnections (scanning lines, signal lines, power supply lines, and the like) on an insulating support board such as a glass substrate or plastic sheet.

The first electrode 60 of the organic EL element 40 is placed on the insulating film on the surface of the wiring board 120. The first electrode 60 is formed from a conductive member having a light transmission property, e.g., ITO (Indium Tin Oxide) or IZO (Indium Zinc Oxide) and functions as an anode.

The organic active layer 64 contains an organic compound having at least a luminous function. The organic active layer 64 may be formed by stacking a hole buffer layer and electron buffer layer, which are formed commonly for the respective colors, an organic luminous layer formed for each color, and the like, or may be formed from two layers which are functionally combined or a single layer. For example, the hole buffer layer is placed between the anode and the organic luminous layer and formed from a thin film made of an aromatic amine derivative, polythiophene derivative, polyaniline derivative, or the like. The organic luminous layer is formed from an organic compound having a luminous function of emitting red, green, or blue light. When, for example, a luminescent polymer material is to be used for this organic luminous layer, the layer is formed from a thin film made of a PPV (polyparaphenylene vinylene) or polyfluorene derivative or its precursor.

The second electrode 66 is placed on the organic active layer 64 commonly for the respective organic EL elements 40. The second electrode 66 is formed from a metal film having an electron injection function such as Ca (calcium), Al (aluminum), Ba (barium), Ag (silver), Yb (ytterbium), or the like, and functions as a cathode. The second electrode 66 may have a two-layer structure formed by covering the surface of a metal film functioning as a cathode with a cover metal. The cover metal is made of, for example, aluminum.

The surface of the second electrode 66 is preferably covered with a hygroscopic material as a desiccant. The organic EL element 40 quickly deteriorates in luminous characteristics when it is exposed to moisture. For this reason, a desiccant 68 is placed on the second electrode 66 corresponding to the surface of the organic EL element 40 in order to protect it from moisture. The desiccant 68 can be any material having hygroscopicity and is formed from an alkali metal such as lithium (Li), sodium (Na), or potassium (K) or its oxide, an alkaline earth metal such as magnesium (Mg), calcium (Ca), or barium (Ba) or its oxide, or the like.

The array substrate 100 includes, in the display area 102, partition walls 70 which separate pixels PX(R, G, B) for at least each of adjacent colors. The partition walls 70 preferably separate the respective pixels from each other. In this case, the partition walls 70 are arranged in a lattice pattern along the periphery of each first electrode 60, and a circular or polygonal opening is formed in each partition wall 70 so as to expose the first electrode 60. The partition wall 70 is made of a resin material and has a structure obtained by stacking the first insulating layer made of a lyophilic organic material and the second insulating layer made of a lyophobic organic material which is placed on the first insulating layer.

In the organic EL element 40 having this arrangement, holes and electrons are injected into the organic active layer 64 sandwiched between the first electrode 60 and the second electrode 66 and are recombined with each other to generate excitons, thereby emitting light having a predetermined wave-length at the time of deactivation of the excitons. In this case, the EL light exits from the lower surface side of the array substrate 100, i.e., the first electrode 60 side.

The array substrate 100 includes an effective portion 106 formed on the major surface of the wiring board 120. The effective portion 106 includes at least the display area 102 for displaying images, and may also include the peripheral area 104 having the scanning line driving circuit 107, signal line driving circuit 108, and the like.

Figure 3:
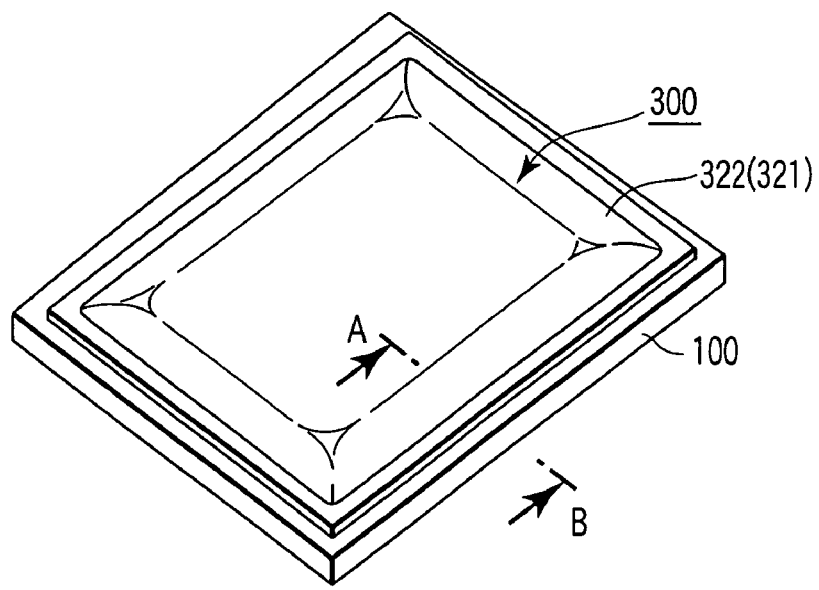
FIG. 3 is a perspective view schematically showing an outer appearance of the array substrate on which a sealer is placed.

As shown in FIGS. 2 and 3, the sealer 300 is placed to cover at least the effective portion 106 of the major surface of the array substrate 100, i.e., the surface on which the organic EL elements 40 are formed. The surface of the sealer 300 is almost planarized.

As shown in FIG. 2, a sealing member 200 is bonded to the sealer 300 with an adhesive applied to its entire surface. The sealing member 200 is formed from an insulating film having a light transmission property such as a plastic sheet, diamond-like carbon, or the like.

The sealer 300 has a structure obtained by stacking at least two buffer layers 311, 312, . . . and barrier layers 321, 322, . . . which are patterns larger in formation area than the buffer layers and cover the respective buffer layers to shield them from the open air. The innermost layer of the sealer 300 (i.e., the layer closest to the array substrate 100) is preferably a barrier layer. This structure has a barrier layer 320 as the innermost layer. In the case shown in FIG. 2, the sealer 300 has the barrier layer 320 as the innermost layer, and the barrier layer 322 as the outermost layer. In addition, each barrier layer preferably covers the entire surface of the immediately lower buffer layer with the peripheral portion of the barrier layer covering side surfaces of the buffer layer. That is, the barrier layers are preferably stacked at their peripheral portions in consideration of the adhesion between the barrier layers and the sealing performance of the sealer.

Each of the buffer layers 311, 312, . . . is formed to have a thickness of about 0.1 to 5 μm by using an organic material (resin material) such as an acrylic-based resin. Each of the buffer layers 311, 312, . . . has a pattern having at least a size almost equal to that of the effective portion 106, and more preferably a size equal to or larger than that of the effective portion 106. In this case, as a material for the buffer layers 311, 312, . . . , a material is preferably selected, which cures so as to absorb the unevenness of the lower layer when it is applied in the state of a liquid exhibiting relatively low viscosity. Each of the buffer layers 311, 312, . . . formed by using such a material has the function of a planarizing layer which planarizes the surfaces of the buffer layers.

Each of the barrier layers 320, 321, 322, . . . is formed to have a thickness of about 500 Å to 3 μm, and preferably about 2,000 Å by using, for example, a metal material such as aluminum or titanium, a metal oxide material such as ITO or IZO, or inorganic material such as a ceramic-based material like alumina. In the case of a bottom emission scheme in which EL light is extracted from the first electrode 60 side, the material to be used for at least one of the barrier layers 320, 321, 322, . . . preferably has a light-shielding property and light reflectivity. In the case of a top emission scheme in which EL light is extracted from the second electrode 66 side, the material to be used for the barrier layers 320, 321, 322, . . . preferably has a light transmission property. In the top emission scheme, the material to be used for the buffer layers 311, 312, . . . also preferably has a light transmission property.

Note that the detailed structure of the sealer 300 will be described in the following embodiments.

FIRST EMBODIMENT

The first embodiment will exemplify a manufacturing method of cutting array substrates corresponding to a plurality of display devices from one mother substrate. Assume that the mother substrate has a plurality of (e.g., four) array portions to be cut as array substrates.

As shown in FIG. 4A, an effective portion 106 is formed on the major surface of a mother substrate 500. In the first embodiment, four almost rectangular effective portions 106 are formed in correspondence with four array portions AR. Assume that in each array portion AR on the mother substrate 500, each effective portion 106 includes various interconnections such as signal lines Xn, scanning lines Ym, and power supply lines P and a plurality of pixels PX each including an organic EL element 40, in addition to pixel switches 10, drive transistors 20, storage capacitor elements 30, a scanning line driving circuit 107, and a signal line driving circuit 108, which are formed by repeatedly performing processes such as forming metal and insulating films and patterning the films shown in FIG. 1.

In the process of forming the effective portion 106, a plurality of alignment marks AM used for the subsequent formation of buffer layers are simultaneously formed. In the first embodiment, since three buffer layers are stacked, the alignment marks AM (a total of three) required for the formation of the respective buffer layers are formed one by one. In the first to third embodiments to be described below, for the sake of simplicity, one alignment mark for the formation of one buffer layer is shown. Obviously, however, a plurality of alignment marks may be arranged for the formation of one buffer layer. That is, at least two alignment marks may be arranged for the formation of each buffer layer, or a larger number of alignment marks may be arranged (for example, near the four corners of the mother substrate). Performing alignment on the basis of many alignment marks in this manner can improve the relative alignment accuracy between a mask and a mother substrate.

The alignment marks AM are formed at the same time when a metal film or insulating film for the formation of the effective portion 106 is patterned. For example, the alignment marks AM are formed by pattering using the same material as that for the scanning lines Ym at the same time when the scanning lines Ym are formed. The alignment marks AM are formed, for example, on the mother substrate 500 at positions outside the array portions AR. However, alignment marks may be formed inside the effective portion 106.

The sealer 300 is then placed to cover at least the effective portion 106 on the major surface of the mother substrate 500. That is, as shown in FIG. 5A, a first barrier layer 320 which shields the effective portion 106 from the open air is formed, as shown in FIG. 5A. The first barrier layer 320 is formed by depositing a metal material.

Figure 10:
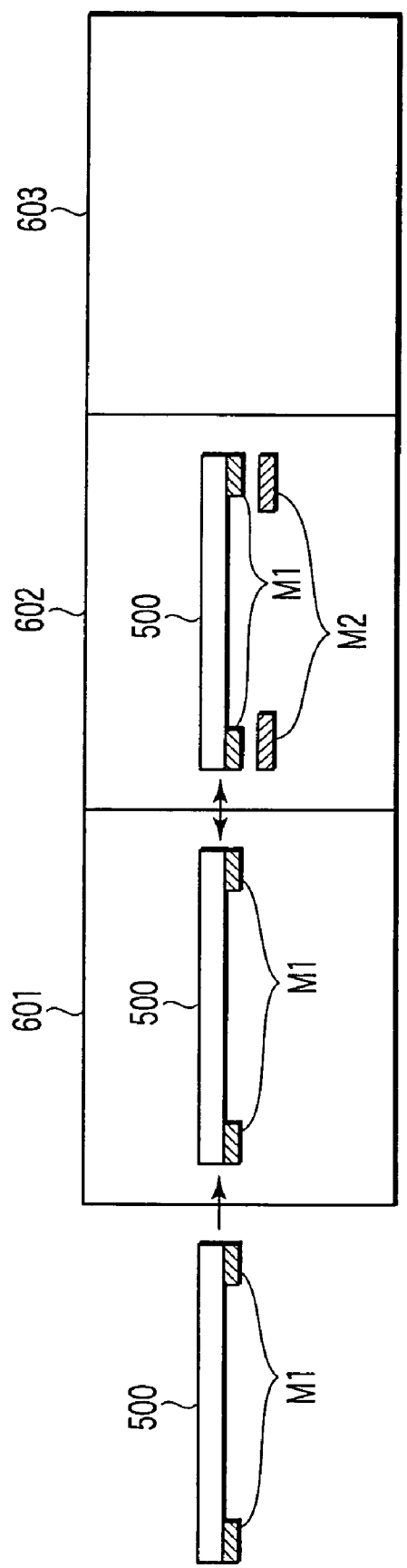
FIG. 10 is a view schematically showing the arrangement of an apparatus for forming a sealer.

More specifically, as shown in FIG. 10, the mother substrate 500 on which the effective portions 106 are formed is integrated with a first mask M1 for the formation of a barrier layer through a holding member (not shown). The first mask M1 is commonly used for the formation of all barrier layers including the first barrier layer, and has opening portions each having a shape corresponding to an area where such a barrier layer is to be formed. This opening portion is a pattern larger than at least the effective portion 106, and is formed, for example, in a rectangular shape almost equal (or equal to or less than) in size to the array portion AR. This makes it possible to form all barrier layers into almost identical patterns.

The mother substrate 500 integrated with the first mask M1 is guided into a first chamber 601 for barrier layer formation. A metal material is then deposited on the major surface of the mother substrate 500, on which the effective portions 106 are formed, through the first mask M1. With this process, the first barrier layer 320 having an almost rectangular shape is formed so as to almost entirely cover the array portion AR.

Subsequently, as shown in FIG. 4B, a first buffer layer 311 which is a pattern larger than at least the effective portion 106 is formed on the first barrier layer 320. The first buffer layer 311 is formed through the following process by using a resin material.

First of all, as shown in FIG. 10, the mother substrate 500 integrated with the first mask M1 is guided into a second chamber 602 for buffer layer formation. The second chamber 602 includes a second mask M2 for buffer layer formation. The second mask M2 is commonly used for the formation of all buffer layers, and has opening portions each having a shape corresponding to an area where such a buffer layer is to be formed. The opening portion is a pattern larger than at least the effective portion 106, and is formed in a rectangular shape smaller than, for example, the opening portion of the first mask M1. This makes it possible to form all buffer layers into almost identical patterns.

As shown in FIG. 4B, the mother substrate 500 guided into the second chamber 602 is aligned with the second mask M2 with reference to a first alignment mark AM1. As shown in FIG. 5B, in the second chamber 602, a resin material 311' is deposited on the major surface of the mother substrate 500, on which the effective portion 106 is formed, through the second mask M2. With this process, the first buffer layer 311 is formed in an almost rectangular area which is placed so as to entirely cover the effective portion 106 of the array portion AR.

When a photosensitive resin material such as an ultraviolet curing resin is used as the resin material 311', the mother substrate 500 on which the resin material 311' is formed is guided into a third chamber 603 for curing to expose the photosensitive resin material 311' to light from a light source with an ultraviolet wavelength at a predetermined exposure amount. The first buffer layer 311 may be formed through this curing process.

In the third chamber 603, the resin material 311' may be cured by applying an electron beam to the material. Alternatively, the second chamber 602 may include a light source or electron beam generator of a photosensitive wavelength for curing a resin material, and a deposition process and curing process for the resin material may be simultaneously performed in the second chamber 602. Furthermore, depositing a resin material which is polymerized in a vapor phase in the second chamber 602 can eliminate the necessity of a curing process.

Assume that one side on which an end portion of the rectangular effective portion 106 is formed is set as a reference position 106R. In this case, let D1 be the shortest distance from one side 106R of the effective portion 106 to one side 311X on which an end portion of the first buffer layer 311 is formed. Note that the shortest distance is defined as a gap when the substrate is observed on a plan view like FIG. 4B from the direction of the normal to the major surface of the substrate. This applies to the following description.

Subsequently, as shown in FIG. 5C, a second barrier layer 321 is formed, which is a pattern larger than the first buffer layer 311 and shields the first buffer layer 311 from the open air. The second barrier layer 321 is substantially identical to the first barrier layer 320 described above, and is formed under the same conditions as those for the first barrier layer 320 in the first chamber 601. Note that a third barrier layer 322 and fourth barrier layer 323 to be described below are substantially identical to the first barrier layer 320 described above and are formed under the same conditions as those for the first barrier layer 320.

Figure 4C:
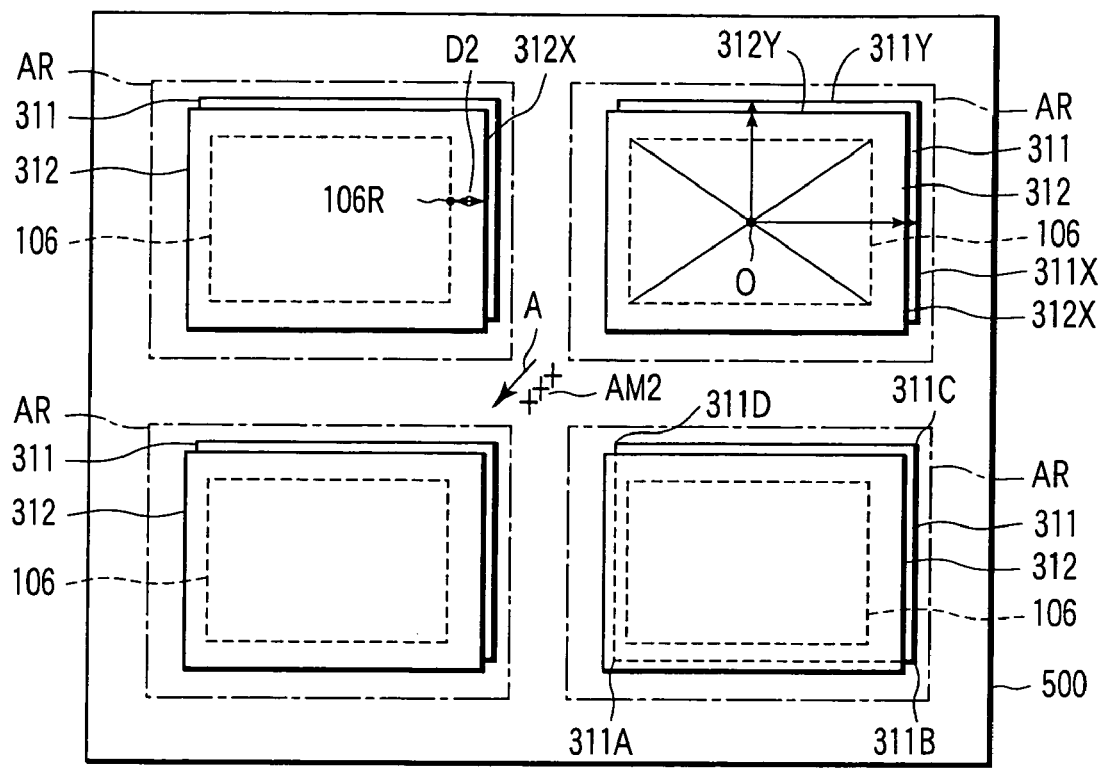
FIG. 4C is a plan view for explaining the method of manufacturing the organic EL display device according to the first embodiment.

Subsequently, as shown in FIG. 4C, a second buffer layer 312 which is a pattern substantially identical to the first buffer layer 311 is formed on the second barrier layer 321. The second buffer layer 312 is formed by using a resin material in the same manner as, for example, the first buffer layer 311. The process of forming the second buffer layer 312 is performed in the second chamber 602, as has been described above with reference to FIGS. 10 and 5B.

At this time, the resin material deposition process for the formation of the second buffer layer 312 is performed under the same conditions as those for the formation of the first buffer layer 311 and by using the same second mask M2 as that used for the formation of the first buffer layer 311. Note, however, that the second mask M2 in this deposition process is aligned at a position relatively different from that in the deposition process for the formation of the first buffer layer 311. That is, the mother substrate 500 is aligned with the second mask M2 reference to a second alignment mark AM2 at a position different from the first alignment mark AM1, and a resin material is deposited on a rectangular area including the entire effective portion 106.

By curing the deposited resin material, the second buffer layer 312 having an almost rectangular shape is formed so as to cover the entire effective portion 106. Letting D2 be the shortest distance from one side 106R of the effective portion 106 to one side 312X on which an end portion of the second buffer layer 312 is formed (i.e., one side closest to one side 106X of the effective portion 106), the distance D2 is different from the distance D1 and shorter than the distance D1.

That is, in spite of the fact that the second buffer layer 312 is formed by using the same second mask M2 as that used for the formation of the first buffer layer 311, the second buffer layer 312 is not formed at a position where it perfectly coincides with the first buffer layer 311, and overlaps the first buffer layer 311 while being shifted relative to the first buffer layer 311 in one direction A (e.g., a diagonal direction of the effective portion 106).

The second buffer layer 312 therefore overlaps a first corner portion 311A of the first buffer layer 311 (i.e., the second buffer layer 312 is placed to cover the first corner portion 311A of the first buffer layer 311) but does not overlap a second corner portion 311B, third corner portion 311C, and fourth corner portion 311D of the first buffer layer 311 (i.e., the second buffer layer 312 is placed to expose the remaining corner portions of the first buffer layer 311). One side 312X of the second buffer layer 312 does not overlap one side 311X of the first buffer layer 311 (obviously, the remaining three sides of the second buffer layer 312 do not overlap the remaining three sides of the first buffer layer 311).

Subsequently, in the same manner as described with reference to FIG. 5C, the third barrier layer 322 is formed, which is a pattern larger than the second buffer layer 312 and shields the second buffer layer 312 from the open air. With this process, the third barrier layer 322 having an almost rectangular shape is formed so as to cover an area larger than the area where the second buffer layer 312 is formed, e.g., almost the entire array portion AR.

Figure 4D:
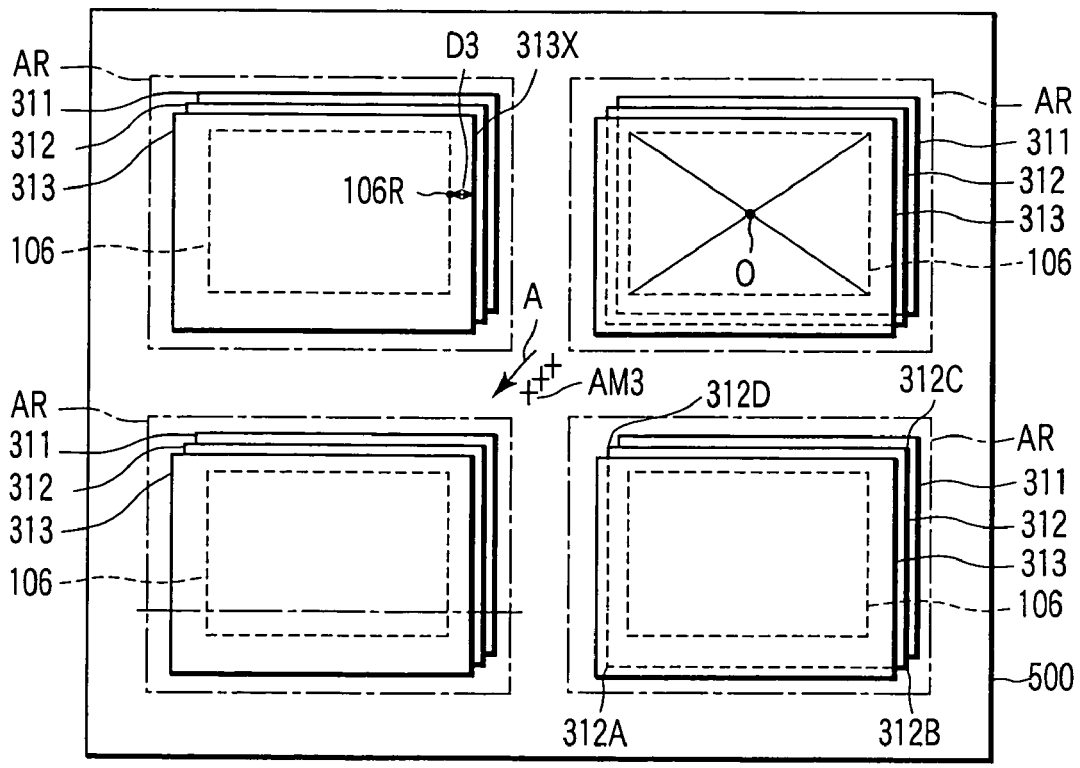
FIG. 4D is a plan view for explaining the method of manufacturing the organic EL display device according to the first embodiment.

As shown in FIG. 4D, a third buffer layer 313 which is a pattern substantially identical to the first buffer layer 311 is formed on the third barrier layer 322. The third buffer layer 313 is formed by using a resin material as in the case of, for example, the first buffer layer 311. The process of forming the third buffer layer 313 is performed in the second chamber 602 as has been described with reference to FIGS. 10 and 5B.

The process of depositing a resin material to form the third buffer layer 313 is performed under the same conditions as those for the formation of the first buffer layer 311, and is performed by using the same second mask M2 as that used when the first buffer layer 311 was formed. Note, however, that the second mask M2 in this deposition process is aligned at a position different from that in the deposition process for the formation of the first buffer layer 311 and second buffer layer 312. That is, the mother substrate 500 is aligned with the second mask M2 with reference to the third alignment mark AM3 at a position different from the positions of the first alignment mark AM1 and second alignment mark AM2, and a resin material is deposited on a rectangular area including the entire effective portion 106.

By curing the deposited resin material, the third buffer layer 313 having an almost rectangular shape is formed so as to cover the entire effective portion 106. Letting D3 be the shortest distance from one side 106R of the effective portion 106 to one side 313X on which an end portion of the third buffer layer 313 is formed (i.e., one side closest to one side 106X of the effective portion 106), the distance D3 is different from the distances D1 and D2, and is shorter than the distance D2.

That is, in spite of the fact that the third buffer layer 313 is formed by using the same second mask M2 as that used for the formation of the first buffer layer 311 and second buffer layer 312, the third buffer layer 313 is not formed at a position where it perfectly coincides with the first buffer layer 311 and second buffer layer 312, and overlaps the second buffer layer 312 while being shifted relative to the second buffer layer 312 in one direction A.

That is, the first buffer layer 311, second buffer layer 312, and third buffer layer 313 are stacked on each other while being shifted from each other in the same direction, i.e., the direction A. Therefore, the third buffer layer 313 overlaps a first corner portion 312A of the second buffer layer 312, but does not overlap a second corner portion 312B, third corner portion 312C, and fourth corner portion 312D of the second buffer layer 312 (obviously, the third buffer layer 313 also overlaps the first corner portion 311A of the first buffer layer 311, but does not overlap the second corner portion 311B, third corner portion 311C, and fourth corner portion 311D of the first buffer layer 311). Furthermore, one side 313X of the third buffer layer 313 does not overlap one side 311X of the first buffer layer 311 and one side 312X of the second buffer layer 312 (obviously, the remaining three sides of the third buffer layer 313 do not overlap the remaining three sides of the first buffer layer 311 and the remaining three sides of the second buffer layer 312).

In the same manner as described with reference to FIG. 5C, the fourth barrier layer 323 is formed, which is a pattern larger than the third buffer layer 313 and shields the third buffer layer 313 from the open air. With this process, the fourth barrier layer 323 having an almost rectangular shape is formed to cover an area larger than the area where the third buffer layer 313 is formed, e.g., almost the entire array portion AR.

The sealer 300 is formed through the above process.

Subsequently, an adhesive is applied to the surface of the sealer 300, i.e., the entire surface of the fourth barrier layer 323, and the sealing member 200 is bonded thereto. Thereafter, the mother substrate 500 is cut in a unit size for each array portion AR. Note that since no sealer is placed on lines along which the mother substrate is cut in a unit size, cutting work is facilitated. In addition, a polarizing plate may be bonded to the surface from which EL light is to be extracted, as needed.

The display device 1 manufactured by the above manufacturing process has a cross-sectional structure like that shown in FIG. 6 when the device is cut along a line VI-VI in FIG. 4D. That is, at least the effective portion 106 of the array substrate 100 is sealed by the sealer 300 having a structure in which the first barrier layer 320, first buffer layer 311, second barrier layer 321, second buffer layer 312, third barrier layer 322, third buffer layer 313, and fourth barrier layer 323 are stacked on each other in the order named.

This makes it possible to reliably cover the organic EL element 40 formed on the effective portion 106 with high robustness against the influences of the lower layers. Even if a microscopic void is formed in any one of the buffer layers or barrier layers, since a plurality of layers are stacked on each other, the route along which the void reaches the organic EL element becomes long. This provides a sufficient effect of prolonging the service life. Therefore, the organic EL element 40 can be shielded from the open air, and sufficient performance can be maintained for a long period of time. In addition, when the sealing member 200 is to be bonded on the sealer 300 with an adhesive or a polarizing plate is to be bonded on the sealing member 200 with an adhesive, any impurities contained in the adhesive can be prevented from entering the organic EL element 40, thereby preventing a deterioration in the performance of the organic EL element.

Since each buffer layer can be formed by using the same mask, it suffices to prepare a single mask in a chamber for the deposition of a resin material. For this reason, in the process of depositing a resin material to form a buffer layer, there is no need to change the mask. This can improve the manufacturing efficiency. In addition, since a plurality of types of expensive masks need not be prepared, the manufacturing cost can be reduced.

If all the three buffer layers to be stacked on each other are formed at positions where they perfectly coincide with each other through the same mask, since the peripheries of the respective buffer layers are stacked on each other at almost the same position, the periphery of the sealer is formed into a steeply inclined surface almost parallel to the normal perpendicular to the major surface of the array substrate 100. In this structure, since the thickness of a barrier layer covering each buffer layer is about 1/1 to 1/10 of the thickness of the buffer layer, a barrier layer which covers an upper buffer layer has difficulty in covering its periphery. This may cause a coverage failure. Forming three buffer layers by using a photolithography process through the same photomask is undesirable because a previously formed organic EL element is exposed to moisture. A microscopic void such as a pinhole may be formed in each buffer layer due to dust or the like adhering to the photomask. In this case, if all the three buffer layers overlap each other at the same position, the pinholes in the respective buffer layers coincide with each other, resulting in a considerable deterioration in airtightness.

In the first embodiment described above, all the buffer layers constituting the sealer are formed to have similar thicknesses, and are stacked so as to be shifted from each other by a distance about 10 times the thickness of each buffer layer. When, for example, these buffer layers are formed to have thicknesses on the order of 1 μm, the first buffer layer 311 overlaps the second buffer layer 312 while being shifted in a predetermined direction A by a distance on the order of about 10 μm. Likewise, the second buffer layer 312 overlaps the third buffer layer 313 while being shifted in a predetermined direction B by a distance on the order of about 10 μm.

That is, the first buffer layer 311, second buffer layer 312, and third buffer layer 313 are each placed to cover the effective portion 106, and are stacked on each other while being shifted in one direction (e.g., a diagonal direction of the effective portion 106) with respect to the effective portion 106. Therefore, no sides of the respective buffer layers overlap each other at almost the same position, and the periphery of the sealer 300 is formed into a moderately inclined surface 300S.

When, therefore, a barrier layer is to be formed to cover an upper buffer layer, the periphery of each buffer layer can be reliably covered, thus preventing the occurrence of a coverage failure. In addition, since the three buffer layers are stacked while being shifted from each other, pinholes in the respective buffer layers do not coincide with each other, thereby preventing a deterioration in airtightness.

Note that when the shift amounts of the respective buffer layers are on the order of about 1 μm, which is smaller than the above value by one order of magnitude, the shift amounts are absorbed by margins for the formation of the respective buffer layers. As a consequence, the effect obtained by stacking a plurality of buffer layers in a shifted state cannot be sufficiently obtained. If the shift amounts of these buffer layers are on the order of about 100 μm, which is larger than the above value by one order of magnitude, the frame width from an end portion of the effective portion 106 to the periphery of the array substrate 100 must be ensured sufficiently as the number of buffer layers to be stacked increases. This structure therefore is disadvantageous in reducing the frame width. In this case, therefore, the shift amounts of the respective buffer layers are preferably on the order of about 10 to 100 μm. That is, the shift amounts of the respective buffer layers are properly determined on the basis of the thickness of each buffer layer, the number of buffer layers to be stacked, and a frame width which can realize a narrow-frame structure.

In addition, each barrier layer is formed to cover the side surfaces of a lower buffer layer, and hence can prevent the entrance of moisture from a direction parallel to the array substrate. In addition, the occurrence of film peeling from a peripheral portion can be reduced.

SECOND EMBODIMENT

The second embodiment will exemplify a manufacturing method of cutting array substrates corresponding to a plurality of display devices from one mother substrate. Assume that the mother substrate has a plurality of (e.g., four) array portions to be cut as array substrates.

Figure 8A:
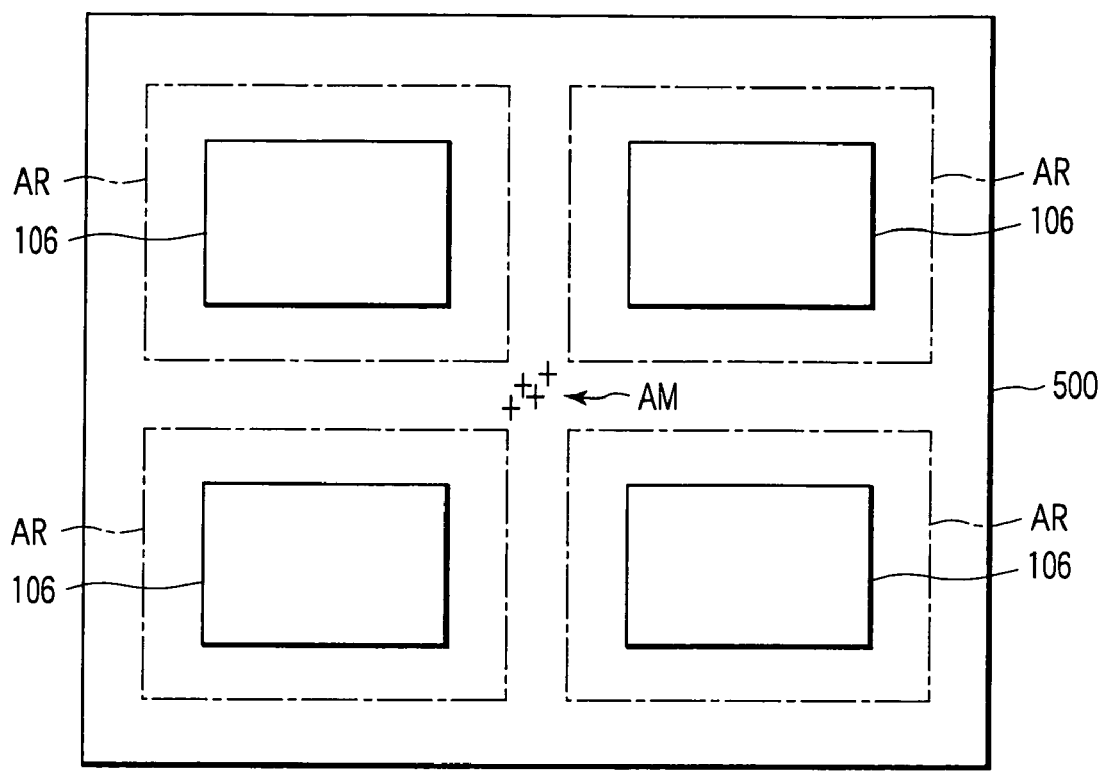
FIG. 8A is a plan view for explaining a method of manufacturing the organic EL display device according to the second embodiment.

As shown in FIG. 8A, effective portions 106 are formed on the major surface of a mother substrate 500. In the second embodiment, as in the first embodiment, four almost rectangular effective portions 106 are formed in correspondence with four array portions AR. In the process of forming the effective portions 106, a plurality of alignment marks AM which are used for the subsequent formation of buffer layers are simultaneously formed. In the second embodiment, in order to stack four buffer layers on each other, four alignment marks AM required to form the respective buffer layers are formed.

A sealer 300 is placed to cover at least each effective portion 106 on the major surface of the mother substrate 500. That is, the sealer 300 is formed by sequentially stacking a first barrier layer 320, first buffer layer 311, second barrier layer 321, second buffer layer 312, third barrier layer 322, third buffer layer 313, fourth barrier layer 323, fourth buffer layer 314, and fifth barrier layer 324 in the order named.

The first to fourth buffer layers are each formed as a pattern larger than at least the effective portion 106. As in the first embodiment, these buffer layers are formed by using, for example, a resin material through the process of depositing a resin material in a second chamber 602, the curing process of curing the resin material in a third chamber 603 as needed, and the like.

The first to fifth barrier layers are each formed as a pattern larger than each buffer layer so as to shield each buffer layer from the open air. Each of these barrier layers is formed in a first chamber 601 as an almost rectangular pattern which is placed to cover an area larger than the area where each buffer layer is formed, e.g., almost the entire array portion AR.

Figure 8B:
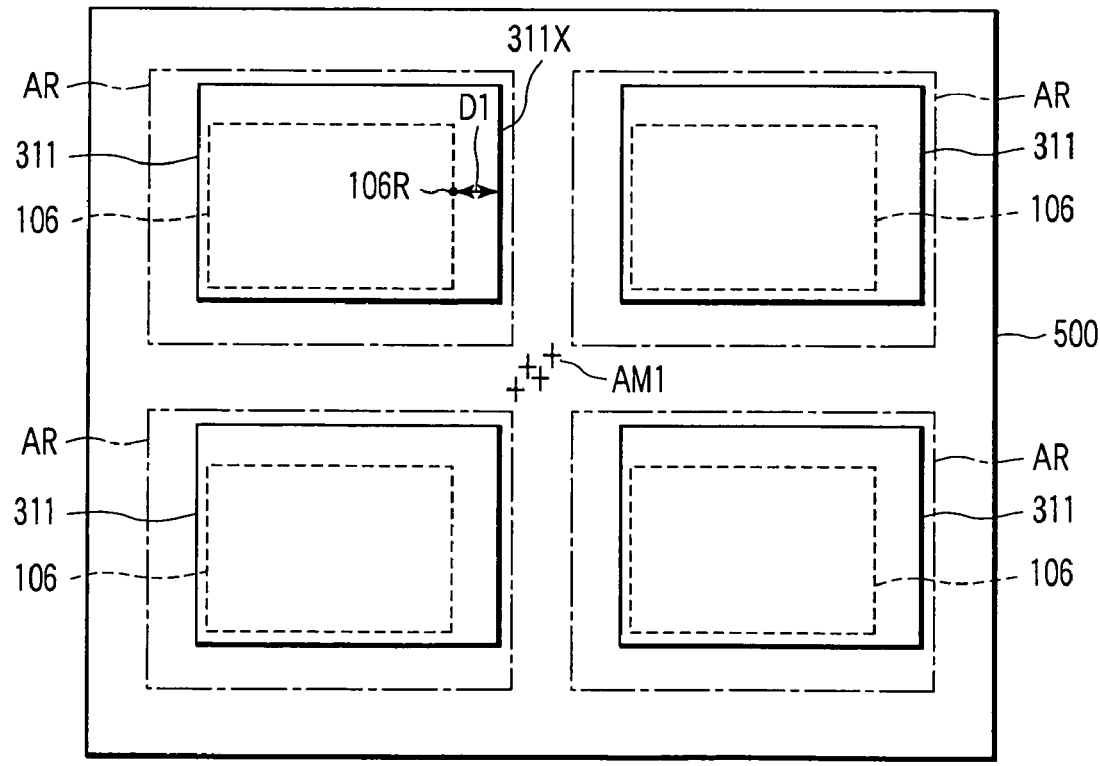
FIG. 8B is a plan view for explaining the method of manufacturing the organic EL display device according to the second embodiment.

In the process of depositing a resin material to form the first buffer layer 311, in the second chamber 602, the mother substrate 500 is aligned with a second mask M2 as a predetermined pattern with reference to a first alignment mark AM1, as shown in FIG. 8B, and a resin material is deposited on a rectangular area including the entire effective portion 106. The first buffer layer 311 having an almost rectangular shape is formed to cover the entire effective portion 106 through this deposition process. Assume that one side on which an end portion of the rectangular effective portion 106 is formed is set as a reference position 106R. In this case, let D1 be the shortest distance from one side 106R of the effective portion 106 to one side 311X on which an end portion of the first buffer layer 311 is formed.

Figure 8C:
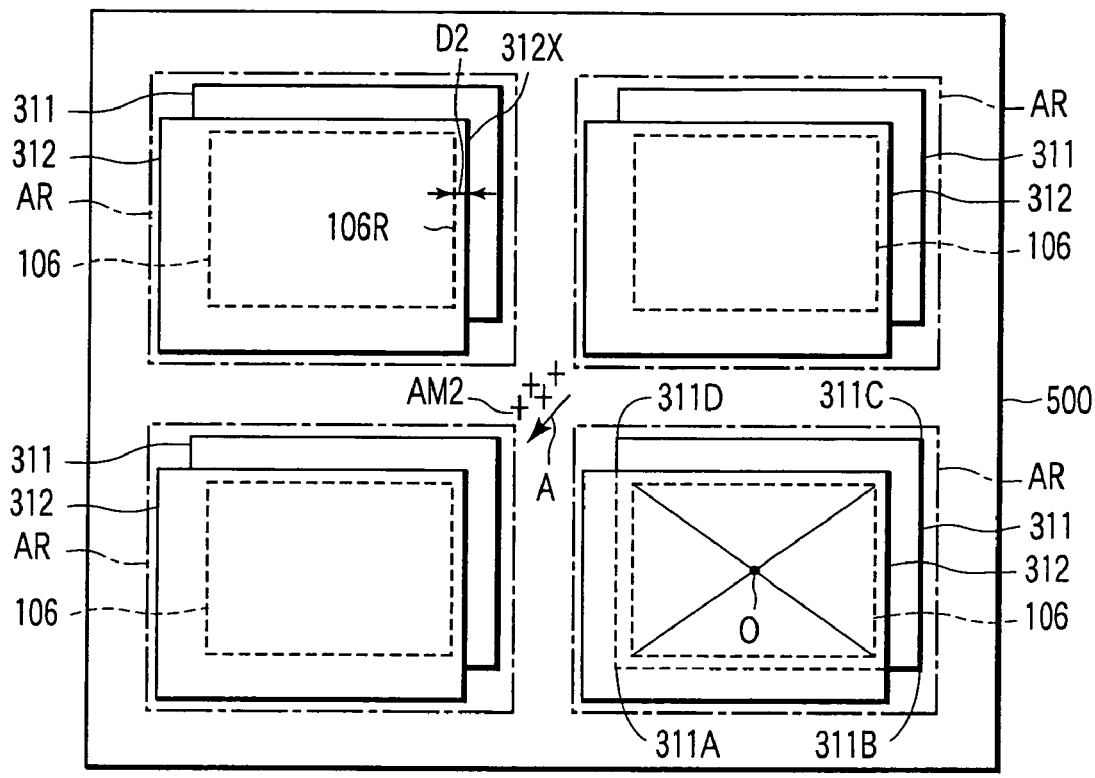
FIG. 8C is a plan view for explaining the method of manufacturing the organic EL display device according to the second embodiment.

In the process of depositing a resin material to form the second buffer layer 312, the same second mask M2 as that used for the formation of the first buffer layer 311 is aligned at a position relatively different from that in the deposition process for the formation of the first buffer layer 311. That is, as shown in FIG. 8C, the mother substrate 500 is aligned with the second mask M2 with reference to a second alignment mark AM2 at a position different from the first alignment mark AM1, and a resin material is deposited on a rectangular area including the entire effective portion 106. The second buffer layer 312 having an almost rectangular shape is formed so as to cover the entire effective portion 106 through this deposition process.

Letting D2 be the shortest distance from one side 106R of the effective portion 106 to a side 312X on which an end portion of the second buffer layer 312 is formed (i.e., one side closest to one side 106X of the effective portion 106), the distance D2 is different from the distance D1 and shorter than the distance D1.

That is, in spite of the fact that the second buffer layer 312 is formed by using the same second mask M2 as that used for the formation of the first buffer layer 311, the second buffer layer 312 is not formed at a position where it perfectly coincides with the first buffer layer 311, and overlaps the first buffer layer 311 while being shifted relative to the first buffer layer 311 in one direction A (e.g., a diagonal direction of the effective portion 106).

The second buffer layer 312 therefore overlaps a first corner portion 311A of the first buffer layer 311 (i.e., the second buffer layer 312 is placed to cover the first corner portion 311A of the first buffer layer 311) but does not overlap a second corner portion 311B, third corner portion 311C, and fourth corner portion 311D of the first buffer layer 311 (i.e., the second buffer layer 312 is placed to expose the remaining corner portions of the first buffer layer 311). One side 312X of the second buffer layer 312 does not overlap one side 311X of the first buffer layer 311 (obviously, the remaining three sides of the second buffer layer 312 do not overlap the remaining three sides of the first buffer layer 311).

Figure 8D:
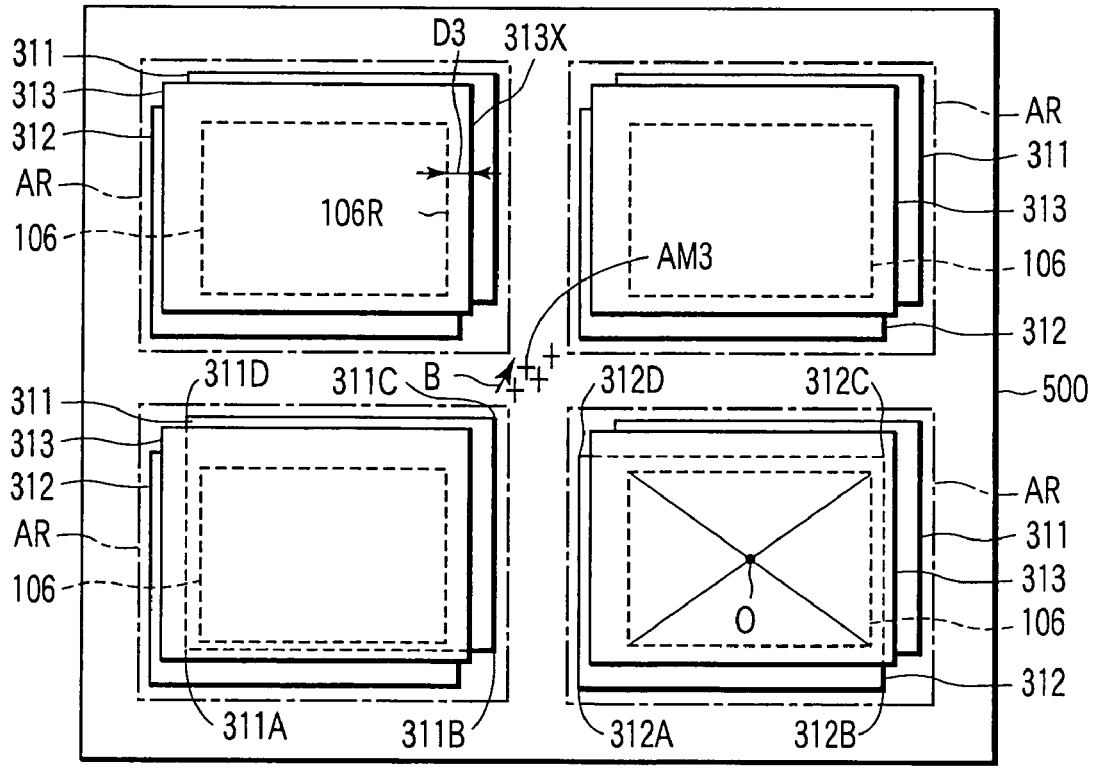
FIG. 8D is a plan view for explaining the method of manufacturing the organic EL display device according to the second embodiment.

In the process of depositing a resin material to form the third buffer layer 313, the same second mask M2 as that used for the formation of the first buffer layer 311 is aligned at a position relatively different from those in the deposition processes for the formation of the first buffer layer 311 and second buffer layer 312. That is, as shown in FIG. 8D, the mother substrate 500 is aligned with the second mask M2 with reference to a third alignment mark AM3 at a position different from the first alignment mark AM1 and second alignment mark AM2, and a resin material is deposited on a rectangular area including the entire effective portion 106. The third buffer layer 313 having an almost rectangular shape is formed so as to cover the entire effective portion 106 through this deposition process.

Letting D3 be the shortest distance from one side 106R of the effective portion 106 to one side 313X on which an end portion of the third buffer layer 313 is formed (i.e., one side closest to one side 106X of the effective portion 106), the distance D3 is different from the distances D1 and D2 and shorter than the distance D1 and longer than the distance D2.

That is, in spite of the fact that the third buffer layer 313 is formed by using the same second mask M2 as that used for the formation of the first buffer layer 311 and second buffer layer 312, the third buffer layer 313 is not formed at a position where it perfectly coincides with the first buffer layer 311 and second buffer layer 312, and overlaps the second buffer layer 312 while being shifted relative to the second buffer layer 312 in one direction B.

The third buffer layer 313 therefore overlaps a third corner portion 312C of the second buffer layer 312, but does not overlap a first corner portion 312A, second corner portion 312B, and fourth corner portion 312D of the second buffer layer 312 (in this case, the third buffer layer 313 also overlaps the first corner portion 311A of the first buffer layer 311, but does not overlap the second corner portion 311B, third corner portion 311C, and fourth corner portion 311D of the first buffer layer 311). Furthermore, one side 313X of the third buffer layer 313 does not overlap one side 311X of the first buffer layer 311 and one side 312X of the second buffer layer 312 (obviously, the remaining three sides of the third buffer layer 313 do not overlap the remaining three sides of the first buffer layer 311 and the remaining three sides of the second buffer layer 312).

Figure 8E:
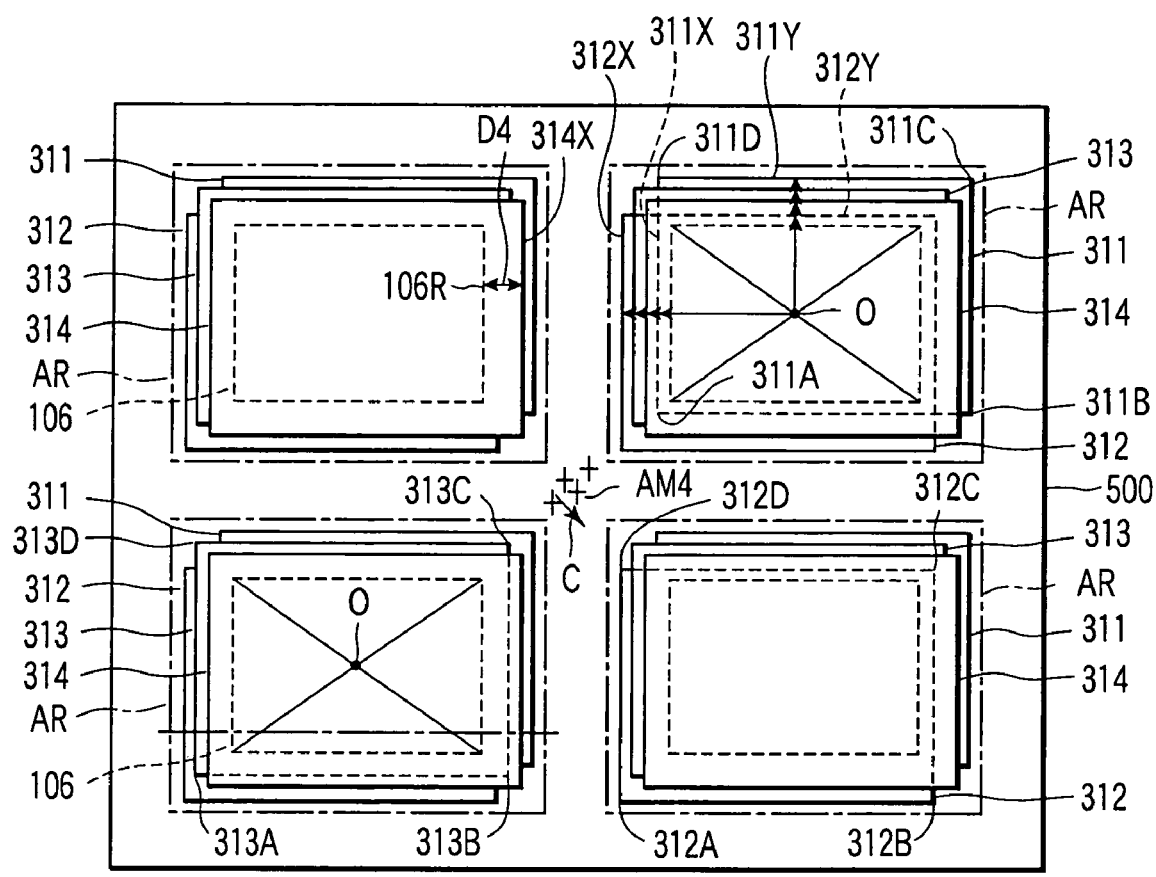
FIG. 8E is a plan view for explaining the method of manufacturing the organic EL display device according to the second embodiment.

In the process of depositing a resin material to form the fourth buffer layer 314, the same second mask M2 as that used for the formation of the first buffer layer 311 is aligned at a position relatively different from those in the deposition processes for the formation of the first buffer layer 311, second buffer layer 312, and third buffer layer 313. That is, as shown in FIG. 8E, the mother substrate 500 is aligned with the second mask M2 with reference to a fourth alignment mark AM4 at a position different from the first alignment mark AM1, second alignment mark AM2, and third alignment mark AM3, and a resin material is deposited on a rectangular area including the entire effective portion 106. The fourth buffer layer 314 having an almost rectangular shape is formed so as to cover the entire effective portion 106 through this deposition process.

Letting D4 be the shortest distance from one side 106R of the effective portion 106 to one side 314X on which an end portion of the fourth buffer layer 314 is formed (i.e., one side closest to one side 106X of the effective portion 106), the distance D4 is different from the distances D1, D2, and D3 and shorter than the distance D1 and longer than the distance D3.

That is, in spite of the fact that the fourth buffer layer 314 is formed by using the same second mask M2 as that used for the formation of the first buffer layer 311, second buffer layer 312, and third buffer layer 313, the fourth buffer layer 314 is not formed at a position where it perfectly coincides with the first buffer layer 311, second buffer layer 312, and third buffer layer 313, and overlaps the third buffer layer 313 while being shifted relative to the third buffer layer 313 in one direction C.

The fourth buffer layer 314 therefore overlaps a second corner portion 313B of the third buffer layer 313, but does not overlap a first corner portion 313A, third corner portion 313C, and fourth corner portion 313D of the third buffer layer 313 (in this case, the fourth buffer layer 314 also overlaps the third corner portion 312C of the second buffer layer 312, but does not overlap the first corner portion 312A, second corner portion 312B, and fourth corner portion 312D. The fourth buffer layer 314 also overlaps the first corner portion 311A of the first buffer layer 311, but does not overlap the second corner portion 311B, third corner portion 311C, and fourth corner portion 311D). Furthermore, one side 313X of the third buffer layer 313 does not overlap one side 311X of the first buffer layer 311 and one side 312X of the second buffer layer 312 (obviously, the remaining three sides of the third buffer layer 313 do not overlap the remaining three sides of the first buffer layer 311 and the remaining three sides of the second buffer layer 312).

The sealer 300 is formed through the above processes.

Subsequently, an adhesive is applied to the surface of the sealer 300, i.e., the entire surface of a fifth barrier layer 324, and the sealing member 200 is bonded thereto. Thereafter, the mother substrate 500 is cut in a unit size for each array portion AR. Note that a polarizing plate may be bonded to the surface from which EL light is to be extracted, as needed.

The display device 1 manufactured by the above manufacturing process has a cross-sectional structure like that shown in FIG. 7 when the device is cut along a line VII-VII in FIG. 8E. That is, at least the effective portion 106 of the array substrate 100 is sealed by the sealer 300 having a structure in which the first barrier layer 320, first buffer layer 311, second barrier layer 321, second buffer layer 312, third barrier layer 322, third buffer layer 313, fourth barrier layer 323, fourth buffer layer 314, and fifth barrier layer 324 are stacked on each other in the order named.

This makes it possible to obtain the same effects as those of the first embodiment. In addition, in the second embodiment described above, the first buffer layer 311, second buffer layer 312, third buffer layer 313, and fourth buffer layer 314 are each arranged to cover the effective portion 106, and are stacked on each other while being shifted in the four directions with respect to the effective portion 106. Therefore, no sides of the respective buffer layers overlap each other at almost the same position, and the periphery of the sealer 300 is formed into a moderately inclined surface 300S. Even if, therefore, the number of buffer layers to be stacked on each other increases, when a barrier layer which covers the upper buffer layer is formed, the periphery of each buffer layer can be reliably covered with the barrier layer. This can prevent a coverage failure.

In contrast to the case wherein a plurality of buffer layers are stacked on each other while being shifted in the same direction as in the first embodiment, in the second embodiment, the respective buffer layers are stacked on each other while being shifted in the four directions, the frame width around each effective portion can be reduced. This makes it possible to provide a structure which is advantageous in achieving a reduction in frame width.

THIRD EMBODIMENT

The third embodiment will exemplify a case wherein an array substrate corresponding to one display device is manufactured from one substrate. Obviously, both the method of stacking buffer layers on each other while displacing them in one direction as in the first embodiment and the method of stacking buffer layers on each other while displacing them in the four directions as in the second embodiment can be applied to the case wherein one array substrate is manufactured from one substrate as in the third embodiment.

Figure 9A:
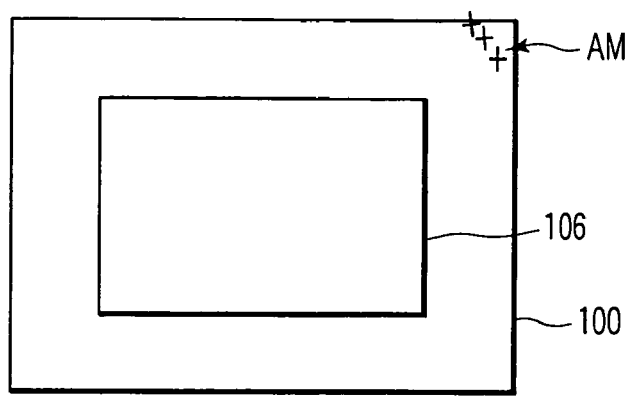
FIG. 9A is a plan view for explaining a method of manufacturing an organic EL display device according to the third embodiment.

As shown in FIG. 9A, an array substrate 100 including an effective portion 106 is formed on the major surface of a substrate. In the process of forming the effective portion 106, a plurality of alignment marks AM used for the subsequent formation of buffer layers are simultaneously formed. In the third embodiment, since three buffer layers are stacked, three alignment marks AM required for the formation of the respective buffer layers are formed.

A sealer 300 is placed to cover at least the effective portion 106 on the major surface of the array substrate 100. That is, the sealer 300 is formed by sequentially stacking a first barrier layer 320, first buffer layer 311, second barrier layer 321, second buffer layer 312, third barrier layer 322, third buffer layer 313, and fourth barrier layer 323 in the order named.

The first to third buffer layers are each formed as a pattern larger than at least the effective portion. 106. As in the first embodiment, these buffer layers are formed by using, for example, a resin material through the process of depositing the resin material in a second chamber 602, the curing process of curing the resin material in a third chamber 603 as needed, and the like.

The first to fourth barrier layers are each larger than each buffer layer and formed to shield each buffer layer from the open air. Each of these barrier layers is formed in a first chamber 601 as an almost rectangular pattern which is placed to cover an area larger than the area where each buffer layer is formed, e.g., almost the entire array substrate 100.

Figure 9B:
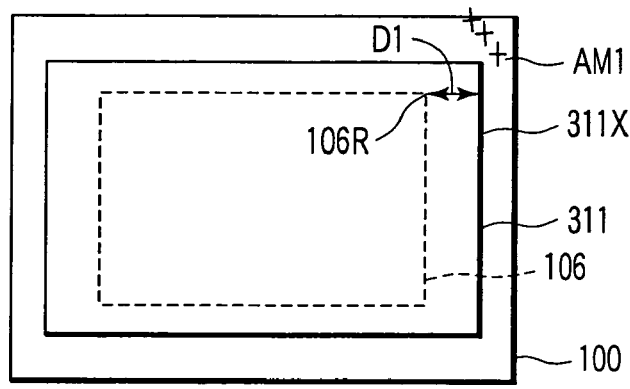
FIG. 9B is a plan view for explaining the method of manufacturing the organic EL display device according to the third embodiment.

In the process of depositing a resin material to form the first buffer layer 311, a mother substrate 500 is aligned with a second mask M2 as a predetermined pattern with reference to a first alignment mark AM1 in the second chamber 602, and a resin material is deposited on a rectangular area including the entire effective portion 106, as shown in FIG. 9B. The first buffer layer 311 having an almost rectangular shape is formed through this process so as to cover the entire effective portion 106. Assume that one side on which an end portion of the rectangular effective portion 106 is formed is set as a reference position 106R (one corner portion of the effective portion 106 in this case). In this case, let D1 be the shortest distance from the reference position 106R of the effective portion 106 to one side 311X on which an end portion of the first buffer layer 311 is formed.

Figure 9C:
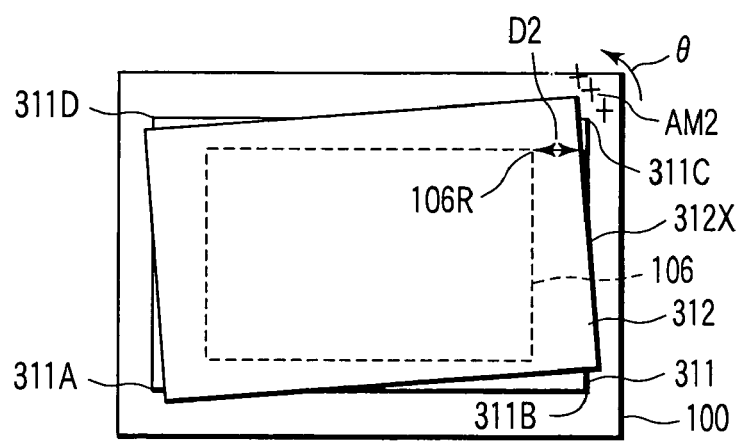
FIG. 9C is a plan view for explaining the method of manufacturing the organic EL display device according to the third embodiment.

In the process of depositing a resin material to form the second buffer layer 312, the same second mask M2 as that used for the formation of the first buffer layer 311 is aligned at a position relatively different from that in the deposition process for the formation of the first buffer layer 311. That is, as shown in FIG. 9C, the mother substrate 500 is aligned with the second mask M2 with reference to the second alignment mark AM2 at a position different from the first alignment mark AM1, and a resin material is deposited on a rectangular area including the entire effective portion 106. The second buffer layer 312 having an almost rectangular shape is formed so as to cover the entire effective portion 106 through this deposition process.

Letting D2 be the shortest distance from the reference position 106R of the effective portion 106 to one side 312X on which an end portion of the second buffer layer 312 is formed (i.e., one side closest to one side 106X of the effective portion 106), the distance D2 is different from the distance D1 and shorter than the distance D1.

That is, in spite of the fact that the second buffer layer 312 is formed by using the same second mask M2 as that used for the formation of the first buffer layer 311, the second buffer layer 312 is not formed at a position where it perfectly coincides with the first buffer layer 311, and overlaps the first buffer layer 311 while being shifted relative to the first buffer layer 311 in a rotational direction θ. In this case, the second buffer layer 312 overlaps the first buffer layer 311 while being shifted in the rotational direction θ by 5°.

The second buffer layer 312 therefore overlaps the first buffer layer 311 so as to expose its all four corner portions. That is, the second buffer layer 312 does not overlap any of a first corner portion 311A, second corner portion 311B, third corner portion 311C, and fourth corner portion 311D of the first buffer layer 311 (the second buffer layer 312 does not overlap all the corners of the first buffer layer 311). In addition, one side 312X of the second buffer layer 312 does not overlap one side 311X of the first buffer layer 311 (obviously, the remaining three sides of the second buffer layer 312 do not overlap the remaining three sides of the first buffer layer 311).

Figure 9D:
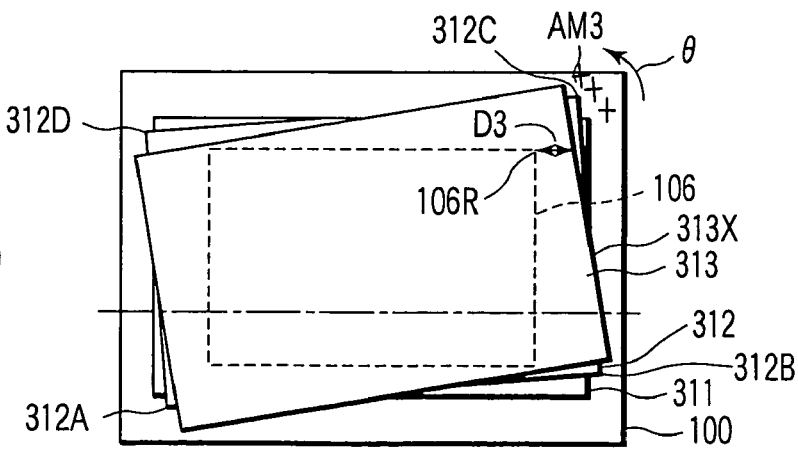
FIG. 9D is a plan view for explaining the method of manufacturing the organic EL display device according to the third embodiment.

In the process of depositing a resin material to form the third buffer layer 313, the same second mask M2 as that used for the formation of the first buffer layer 311 is aligned at a position relatively different from those in the deposition processes for the formation of the first buffer layer 311 and second buffer layer 312. That is, as shown in FIG. 9D, the mother substrate 500 is aligned with the second mask M2 with reference to a third alignment mark AM3 at a position different from the first alignment mark AM1 and second alignment mark AM2, and a resin material is deposited on a rectangular area including the entire effective portion 106. The third buffer layer 313 having an almost rectangular shape is formed so as to cover the entire effective portion 106 through this deposition process.

Letting D3 be the shortest distance from one side 106R of the effective portion 106 to one side 313X on which an end portion of the third buffer layer 313 is formed (i.e., one side closest to one side 106X of the effective portion 106), the distance D3 is different from the distances D1 and D2 and shorter than the distances D1 and D2.

That is, in spite of the fact that the third buffer layer 313 is formed by using the same second mask M2 as that used for the formation of the first buffer layer 311 and second buffer layer 312, the third buffer layer 313 is not formed at a position where it perfectly coincides with the first buffer layer 311 and second buffer layer 312, and overlaps the second buffer layer 312 while being shifted relative to the second buffer layer 312 in the rotational direction θ. In this case, the third buffer layer 313 overlaps the second buffer layer 312 while being shifted in the rotational direction θ by 5° (obviously, the third buffer layer 313 overlaps the first buffer layer 311 while being shifted therefrom in the rotational direction by 10°).

The third buffer layer 313 therefore overlaps the second buffer layer 312 so as to expose its all four corner portions. That is, the third buffer layer 313 does not overlap any of a first corner portion 312A, second corner portion 312B, third corner portion 312C, and fourth corner portion 312D of the second buffer layer 312 (the third buffer layer 313 does not overlap any of the first corner portion 311A, second corner portion 311B, third corner portion 311C, and fourth corner portion 311D of the first buffer layer 311). In addition, one side 313X of the third buffer layer 313 does not overlap one side 311X of the first buffer layer 311 and one side 312X of the second buffer layer 312 (obviously, the remaining three sides of the third buffer layer 313 do not overlap the remaining three sides of the second buffer layer 312).

The sealer 300 is formed through the above processes.

Subsequently, an adhesive is applied to the surface of the sealer 300, i.e., the entire surface of the fourth barrier layer 323, and a sealing member 200 is bonded thereto. Thereafter, a polarizing plate may be bonded to the surface from which EL light is to be extracted, as needed.

The display device 1 manufactured by the above manufacturing process has a cross-sectional structure like that shown in FIG. 6 when the device is cut along a line VI-VI in FIG. 9D. That is, at least the effective portion 106 of the array substrate 100 is sealed by the sealer 300 having a structure in which the first barrier layer 320, first buffer layer 311, second barrier layer 321, second buffer layer 312, third barrier layer 322, third buffer layer 313, and fourth barrier layer 323 are stacked on each other in the order named. Therefore, the same effects as those of the first embodiment can be obtained.

As described above, according to the first to third embodiments, there is provided a display device including an almost rectangular effective portion which is formed on the major surface of a substrate and includes a plurality of pixels for displaying images, and a sealer placed to cover at least the effective portion on the major surface of the substrate. This display device is characterized in that the sealer has a structure in which at least two almost rectangular buffer layers having substantially the same pattern and barrier layers each of which is a pattern larger than each buffer layer and covers it so as to shield it from the open air are stacked on each other, and the shortest distance from one side of an end of the effective portion to one side of an end of the first buffer layer is different from the shortest distance to one side of an end of the second buffer layer.

More specifically, the shortest distances from a center (the intersection of two diagonal lines of the rectangular effective portion) O of the effective portion 106 to two orthogonal sides 311X and 311Y of the first buffer layer 311 are different from the shortest distances to two orthogonal sides 312X and 312Y of the second buffer layer 312 (see, for example, FIGS. 4C and 8E).

That is, when a reference position is set on the effective portion, although a plurality of buffer layers are the same pattern, the shortest distances from the reference position to predetermined sides of the respective buffer layers differ from each other. Therefore, the respective buffer layers are stacked on each other in the plane of the major surface of the substrate while being shifted from each other.

When, for example, a plurality of buffer layers are stacked on each other while being shifted in the same direction with reference to an effective portion as in the first embodiment, each subsequent layer overlaps one corner portion of a corresponding previous layer. More specifically,. the second buffer layer 312 which is subsequently stacked overlaps one corner portion 311A of the first buffer layer 311 which is previously formed, and the third buffer layer 313 which is stacked next overlaps one corner portion 312A of the second buffer layer 312 which is previously formed. All the corner portions 311A and 312A which are covered with subsequently stacked buffer layers are located in the same diagonal direction when viewed from the center O of the effective portion 106 (see FIGS. 4C and 4D).

When a plurality of buffer layers are stacked while being shifted in the four directions with reference to an effective portion as in the second embodiment, a sealer includes at least three buffer layers. The second buffer layer which is stacked after the first buffer layer overlaps one corner portion of the first buffer layer which is previously formed, and the third buffer layer which is subsequently stacked overlaps one corner portion of the second buffer layer which is previously formed. More specifically, the second buffer layer 312 which is subsequently stacked overlaps one corner portion 311A of the first buffer layer 311 which is previously formed, and the third buffer layer 313 which is stacked next overlaps one corner portion 312C of the second buffer layer 312 which is previously formed. The fourth buffer layer 314 which is stacked next overlaps one corner portion 313B of the third buffer layer 313 which is previously formed. All the corner portions 311A, 312C, and 313B covered with the buffer layers which are subsequently stacked are located at different diagonal directions when viewed from the center O of the effective portion 106 (see FIGS. 8C, 8D, and 8E).

When a plurality of buffer layers are stacked on each other while being shifted in the rotational direction with reference to an effective portion as in the third embodiment, each buffer layer which is subsequently stacked overlaps a corresponding buffer layer which is previously formed, with its four corner portions being exposed. More specifically, the second buffer layer 312 which is subsequently stacked does not overlap any of the four corner portions of the first buffer layer 311 which is previously formed, and the third buffer layer 313 which is stacked next does not overlap any of the four corner portions of the second buffer layer 312 which is previously formed (see FIGS. 9B to 9D).

With this structure, the peripheral portions of the respective buffer layers in the four directions are not superposed on each other, and the periphery of the sealer is formed into a moderately inclined surface. Even if a buffer layer and barrier layer are formed as upper layers, their peripheries can be reliably covered, and the occurrence of a coverage failure can be prevented. In addition, since a plurality of buffer layers are stacked while being shifted from each other, even if all the buffer layers are formed by using the same mask, there is no chance that pinholes in the respective buffer layers will coincide with each other. This makes it possible to prevent a deterioration in airtightness. Therefore, stable, excellent display performance can be maintained for a long period of time.

In addition, since the number of masks required to form buffer layers is smaller than the number of buffer layers to be formed, the operation of changing the masks is facilitated, and the manufacturing efficiency can be improved. In addition, the manufacturing cost can be reduced.

The first to third embodiments described above have exemplified the sealer comprising three buffer layers and the sealer comprising four buffer layers. However, it suffices if a sealer is comprised of at least two layers which are stacked while being shifted from each other. Note that if a sealer is to be formed by stacking 10 or more buffer layers, the productivity decreases due to an excessive number of steps. For this reason, the number of buffer layers to be stacked is set to two or more and less than 10, and preferably three to five.

In the first to third embodiments, all the buffer layers constituting the sealer are formed as identical patterns. However, it suffices if at least two of a plurality of layers are formed as identical patterns. This eliminates the necessity to prepare masks equal in number to the layers to be formed, which in turn makes it possible to not only reduce the work load of mask changing operation but also reduce the manufacturing cost because of a decrease in the number of masks to be prepared.

In the first to third embodiments, the base barrier layer and the first to fourth barrier layers are arranged as almost identical patterns to cover almost the entire array substrate. However, the respective barrier layers may be stacked while being shifted from each other like the respective buffer layers.

In the first to third embodiments, a mask is fixed and the array substrate is shifted to align an alignment mark with the position of the mask. However, the array substrate may be fixed and the mask may be aligned with the position of the alignment mark. In other words, it suffices if the mask and array substrate are positioned relative to each other by using the alignment mark.

FOURTH EMBODIMENT

In a sealer 300 according to the fourth embodiment, at least one buffer layer has a pattern different in size from the remaining buffer layers. In addition, at least one buffer layer is stacked such that its outer peripheral portion is located inside or outside outer peripheral portions of the remaining buffer layers within the major surface of a substrate.

For example, as shown in FIGS. 11A and 11B, the sealer 300 is comprised of a first barrier layer 320 which is placed to cover an effective portion 106, a first buffer layer 311 which is placed on the first barrier layer 320 in correspondence with the effective portion 106, a second barrier layer 321 which has a pattern larger than the first buffer layer 311 and is placed to cover the first buffer layer 311, a second buffer layer 312 which is placed on the second barrier layer 321 in correspondence with the effective portion 106, and a third barrier layer 322 which has a pattern larger than the second buffer layer 312 and is placed to cover the second buffer layer 312.

In the case shown in FIGS. 11A and 11B, the first buffer layer 311 has a pattern larger in size than the second buffer layer 312 which is placed above the first buffer layer 311, and the second buffer layer 312 is stacked such that its outer peripheral portion 312A is located inside an outer peripheral portion 311A within the major surface of the substrate.

More specifically, when an array substrate 100 on which the sealer 300 is placed is observed from the direction of the normal to the major surface of the array substrate 100, the outer peripheral portion 312A of the second buffer layer 312 is located closer to an end portion 106A of the effective portion 106 than the outer peripheral portion 311A of the first buffer layer 311. That is, when the array substrate 100 on which the sealer 300 is placed is viewed two-dimensionally, a distance D1 from the outer peripheral portion 311A of the first buffer layer 311 to an end portion 106A of the effective portion 106 is different from a distance D2 from the outer peripheral portion 312A of the second buffer layer 312 to the end portion 106A of the effective portion 106. In this case, the distance D1 is larger than the distance D2.

The second buffer layer 312 is not formed at a position where it perfectly coincides with the first buffer layer 311. That is, the outer peripheral portion 312A of the second buffer layer 312 overlaps the outer peripheral portion 311A of the first buffer layer 311 which being relatively shifted therefrom.

If all the two buffer layers to be stacked are formed at a position where they perfectly coincide with each other, the periphery of the sealer 300 is formed into a steeply inclined surface almost parallel to the normal to the major surface of the array substrate 100, as described above. In this structure, a barrier layer which covers a buffer layer at an upper position has difficulty in covering its periphery. This may cause a coverage failure.

For this reason, a plurality of buffer layers constituting the sealer 300 are all formed to have similar thicknesses and are stacked on each other while their outer peripheral portions are shifted from each other by at least a distance almost equal to the thickness of each buffer layer, preferably about 10 times the thickness of each buffer layer. The shift amount of the outer peripheral portion of each buffer layer is defined by, for example, (D1-D2).

If, for example, these buffer layers are formed to have thicknesses on the order of 10 μm, the outer peripheral portion 311A of the first buffer layer 311 overlaps the outer peripheral portion 312A of the second buffer layer 312 while being shifted from it by a distance on the order of about 10 μm. The shift amount of each buffer layer is preferably on the order of about 10 to 100 μm as in the first to third embodiments described above. That is, the first buffer layer 311 and second buffer layer 312 are each placed to cover the effective portion 106 and are stacked on each other while their outer peripheral portions are shifted from each other. This prevents any sides of the respective buffer layers from overlapping each other at almost the same position, and hence the periphery of the sealer 300 is formed into a moderately inclined surface 300S.

When, therefore, a barrier layer is to be formed to cover an upper buffer layer, the periphery of each buffer layer can be reliably covered, thus preventing the occurrence of a coverage failure, which can in turn prevent moisture, oxygen, and the like from entering each organic EL element, thereby suppressing a deterioration in the quality of each organic EL element. Therefore, good display performance can be maintained for a long period of time.

In the case shown in FIGS. 11A and 11B, the sealer 300 includes two buffer layers. When, however, the sealer 300 is to include three or more buffer layers, an upper layer (a buffer layer located more distant from the array substrate 100) preferably has a pattern with a smaller size. It, however, suffices if at least one buffer layer has a pattern different in size from the remaining buffer layers, and the respective layers are stacked on each other while their outer peripheral portions are shifted from each other. This makes it possible to form the periphery of the sealer 300 into the moderately inclined surface 300S, thereby obtaining the same effects as those described above.

Figure 12A:
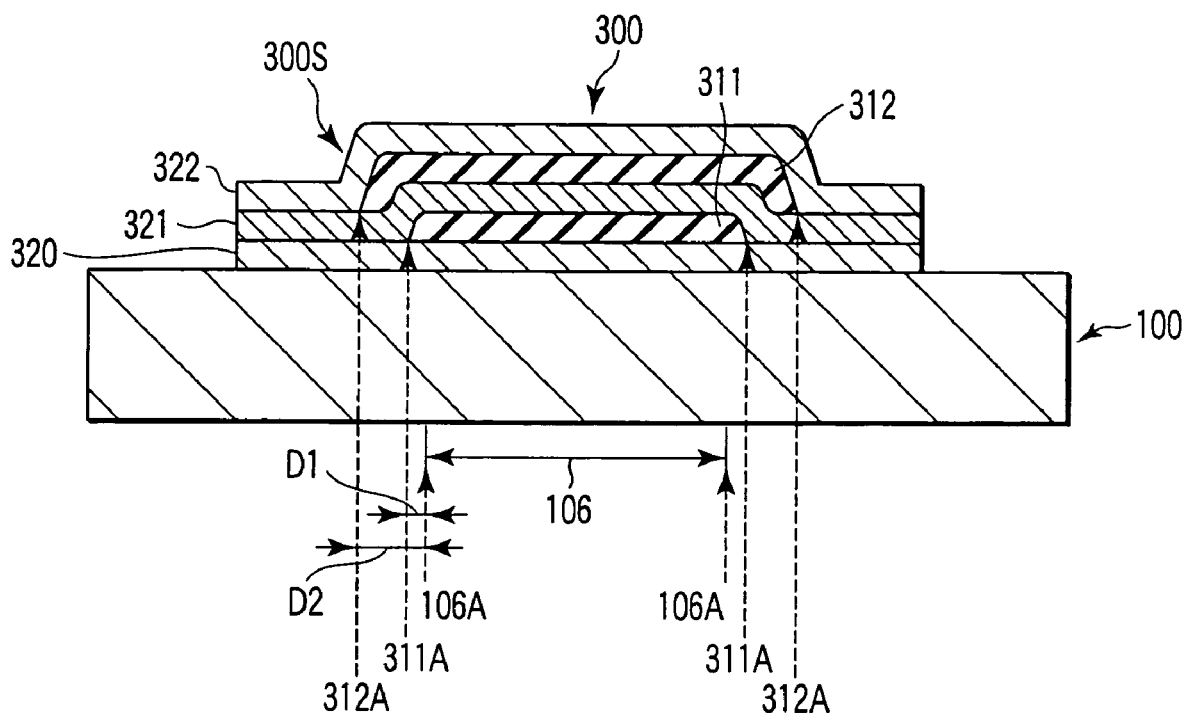
FIG. 12A is a view schematically showing another cross-sectional structure of the sealer when the array substrate shown in FIG. 3 is cut along a line A-B.
Figure 12B:
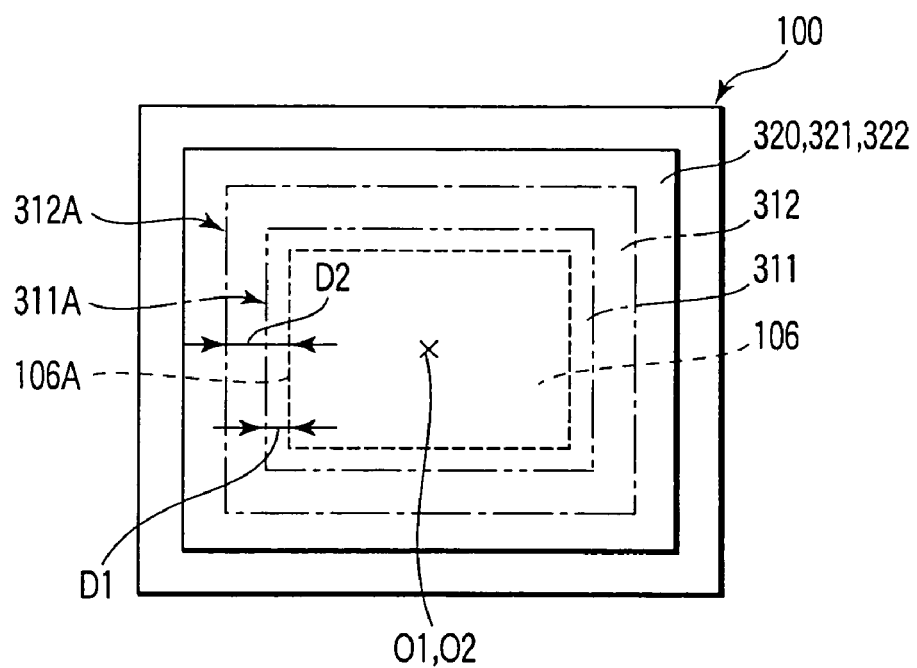
FIG. 12B is a view schematically showing a two-dimensional structure of the array substrate and sealer shown in FIG. 12A.

The sealer 300 shown in FIGS. 12A and 12B is comprised of the first barrier layer 320 which is placed to cover the effective portion 106, the first buffer layer 311 which is placed on the first barrier layer 320 in correspondence with the effective portion 106, the second barrier layer 321 which is a pattern larger than the first buffer layer 311 and is placed to cover the first buffer layer 311, the second buffer layer 312 which is placed on the second barrier layer 321 in correspondence with the effective portion 106, and the third barrier layer 322 which is a pattern larger than the second buffer layer 312 and is placed to cover the second buffer layer 312.

In the case shown in FIGS. 12A and 12B, the first buffer layer 311 has a pattern smaller in size than the second buffer layer 312 which is placed above the first buffer layer 311, and they are stacked on each other such that the outer peripheral portion 312A of the second buffer layer 312 is located outside the outer peripheral portion 311A of the first buffer layer 311 within the major surface of the substrate.

More specifically, when the array substrate 100 on which the sealer 300 is placed is observed from the direction of the normal to the major surface of the array substrate 100, the outer peripheral portion 311A of the first buffer layer 311 is located closer to the end portion 106A of the effective portion 106 than the outer peripheral portion 312A of the second buffer layer 312. That is, when the array substrate 100 on which the sealer 300 is placed is viewed two-dimensionally, the distance D1 from the outer peripheral portion 311A of the first buffer layer 311 to the end portion 106A of the effective portion 106 is different from the distance D2 from the outer peripheral portion 312A of the second buffer layer 312 to the end portion 106A of the effective portion 106. In this case, the distance D1 is smaller than the distance D2.

The second buffer layer 312 is not formed at a position where it perfectly coincides with the first buffer layer 311. That is, the outer peripheral portion 312A of the second buffer layer 312 overlaps the outer peripheral portion 311A of the first buffer layer 311 which being relatively shifted therefrom. As in the case shown in FIGS. 11A and 11B, a plurality of buffer layers constituting the sealer 300 are all formed to have similar thicknesses and are stacked on each other while their outer peripheral portions are shifted from each other by at least a distance almost equal to the thickness of each buffer layer, preferably about 10 times the thickness of each buffer layer. The shift amount of the outer peripheral portion of each buffer layer is defined by, for example, (D2-D1). The shift amount of each buffer layer is preferably on the order of about 10 to 100 μm in consideration of the effects obtained by stacking a plurality of buffer layers while shifting them from each other and a reduction in frame width.

In this manner, the first buffer layer 311 and second buffer layer 312 are each placed to cover the effective portion 106 and are stacked such that their outer peripheral portions are shifted from each other. Since the upper buffer layer is placed to cover the lower buffer layer, in particular, the sealing performance of the sealer can be improved. This can prevent moisture, oxygen, and the like from entering each organic EL element, which can in turn suppress a deterioration in the quality of each organic EL element. Therefore, good display performance can be maintained for a long period of time.

In the case shown in FIGS. 12A and 12B, the sealer 300 includes two buffer layers. When, however, the sealer 300 is to include three or more buffer layers, an upper layer (a buffer layer located more distant from the array substrate 100) preferably has a pattern with a larger size. It, however, suffices if at least one buffer layer has a pattern different in size from the remaining buffer layers, and the respective layers are stacked on each other while their outer peripheral portions are shifted from each other. This makes it possible for the upper buffer layer to reliably cover the lower buffer layer, thereby obtaining the same effects as those described above.

In either of the cases shown in FIGS. 11A and 11B and FIGS. 12A and 12B, all the barrier layers are formed to have the same size. However, the present invention is not limited to this structure, and the respective layers may have different sizes.

A method of manufacturing an organic EL element will be described next. For the sake of simplicity, a method of manufacturing an organic EL display device including a sealer with the structure shown in FIGS. 11A and 11B will be described.

Figure 13A:
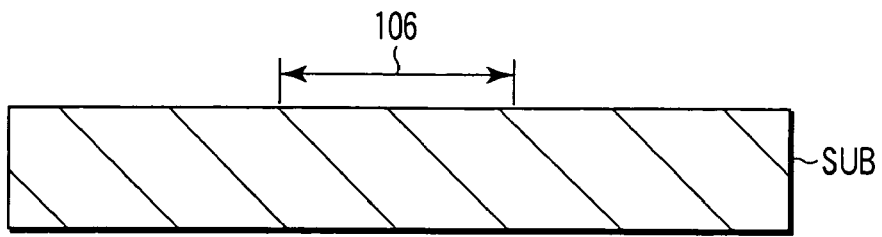
FIG. 13A is a schematic sectional view for explaining a method of manufacturing an organic EL display device.

First of all, as shown in FIG. 13A, a substrate SUB having the effective portion 106 formed on its major surface is prepared. Assume that the effective portion 106 includes various interconnections such as signal lines Xn, scanning lines Ym, and power supply lines P and a plurality of pixels PX each including an organic EL element 40, in addition to pixel switches 10, drive transistors 20, storage capacitor elements 30, a scanning line driving circuit 107, and a signal line driving circuit 108, which are formed by repeatedly performing processes such as forming metal and insulating films and patterning the films.

The sealer 300 is placed on the major surface of the substrate SUB so as to cover at least the effective portion 106.

Figure 14:
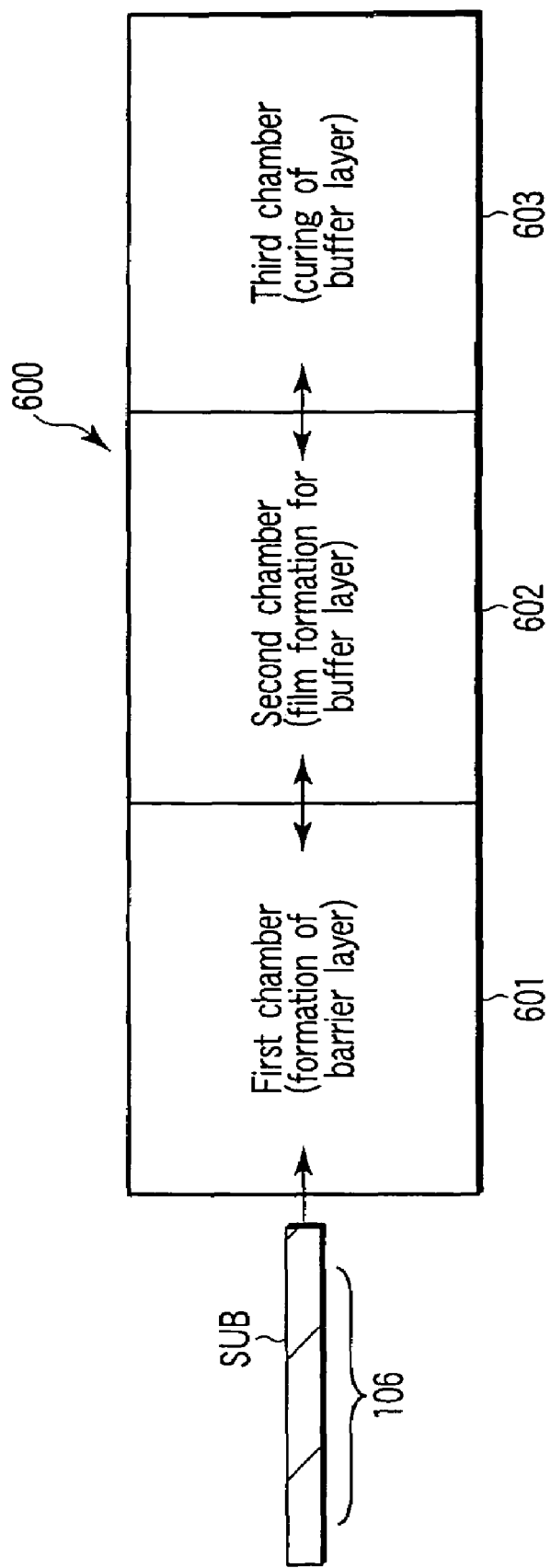
FIG. 14 is a view schematically showing the arrangement of a manufacturing apparatus for forming a sealer.

The sealer 300 is formed by a manufacturing apparatus 600 having an arrangement like that shown in FIG. 14. The manufacturing apparatus 600 includes a first chamber 601 for forming barrier layers, a second chamber 602 for forming films from a resin material for the formation of buffer layers, and a third chamber 603 for curing the resin material films.

In the first chamber 601, a metal material functioning as a barrier layer is deposited through a barrier layer mask having an opening portion with a predetermined shape. The barrier layer mask to be used in this case may be placed in the first chamber 601 so as to be positioned in a predetermined positional relationship with respect to the substrate SUB which is introduced into the chamber with the effective portion 106 facing the deposition source, or may be mounted on the substrate SUB, on which the effective portion 106 is formed, while being positioned in a predetermined positional relationship.

In the second chamber 602, the liquid monomer of a resin material functioning as a buffer layer is vaporized to form a film through a buffer layer mask having an opening portion with a predetermined shape. As shown in FIG. 15, the second chamber 602 includes a buffer layer mask M between a material source S for the formation of a buffer layer and the major surface of the substrate SUB on which the effective portion 106 is formed. The buffer layer mask M can move in the direction of the normal to the substrate SUB while being parallel to the major surface of the substrate SUB.

That is, in the second chamber 602, a process is performed by using the phenomenon in which as the gap between the substrate SUB and the buffer layer mask M increases, a pattern of a film formed on the major surface of the substrate SUB spreads more than an opening portion AP of the buffer layer mask M.

When, for example, the buffer layer mask M is positioned at a first position P1 relatively distant from the major surface of the substrate SUB, a relatively larger first gap G1 is formed between the substrate SUB and the buffer layer mask M. Placing the buffer layer mask M at the first position P1 restrains the resin material scattered from the material source S from reaching the major surface of the substrate SUB, and allows the resin material passing through the opening portion AP to reach a first area AR1 on the major surface of the substrate SUB. That is, the resin material is formed into a film on the first area AR1.

In contrast to this, when the buffer layer mask M is positioned at a second position P2 relatively close to the major surface of the substrate SUB, a relatively small second gap G2 is formed between the substrate SUB and the buffer layer mask M. Placing the buffer layer mask M at the second position P2 further restrains the resin material scattered from a material source S from reaching the major surface of the substrate SUB, and allows the resin material passing through the opening portion AP to reach a second area AR2 on the major surface of the substrate SUB. That is, the resin material is formed into a film on the second area AR2 smaller than the first area AR1.

That is, when a resin material is formed into films through the mask M having the opening portion AP with the same pattern to form the respective buffer layers constituting the sealer 300, the mask M is positioned in the respective film formation processes such that the gap from the major surface of the substrate SUB to the mask M is made to vary, thereby forming buffer layers having patterns with different sizes. It is therefore unnecessary to prepare a plurality of masks to form a plurality of buffer layers having patterns with different sizes. This makes it possible to reduce the manufacturing cost.

In the third chamber 603, a monomer film is polymerized to cure the resin material. When a photosensitive resin material (e.g., an ultraviolet curing resin material) is used as a monomer, the third chamber 603 includes a light source with a predetermined wavelength (e.g., an ultraviolet wavelength). In the third chamber 603, when the monomer film is exposed to a predetermined amount of light, the monomer is polymerized to be cured, thereby forming a buffer layer.

When an electron beam curing resin material is used as a monomer, the third chamber 603 includes an electron beam source. In the third chamber 603, when the monomer formed into a film is irradiated with an electron beam, the monomer is polymerized to be cured, thereby forming a buffer layer.

In this case, in order to form buffer layers, the second chamber 602 for film formation and the third chamber 603 for curing are prepared. However, the second chamber 602 may include a light source with a predetermined wavelength or an electron beam source, and a film formation process and curing process may be simultaneously performed in the second chamber 602. Furthermore, depositing a resin material which is polymerized in a vapor phase in the second chamber 602 can eliminate the necessity of a curing process (third chamber).

Assume that in the process of forming the sealer 300 to be described below, a barrier layer mask is mounted in advance on the substrate SUB, on which the effective portion 106 is formed, while being positioned in a predetermined positional relationship.

Figure 13B:
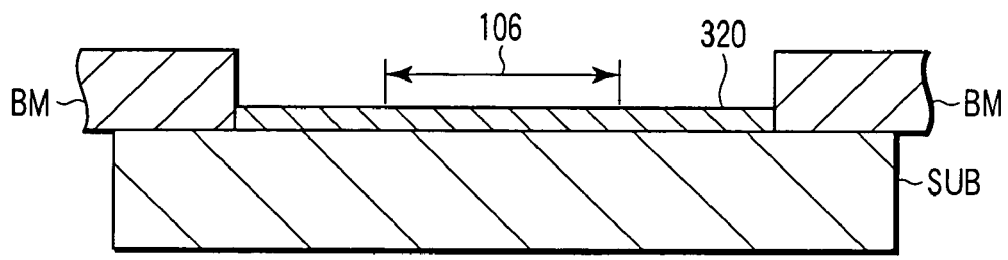
FIG. 13B is a schematic sectional view for explaining a method of manufacturing the first barrier layer of a sealer to be used for the organic EL display device.

First of all, as shown in FIG. 13B, the first barrier layer 320 which shields the effective portion 106 from the open air is formed on the major surface of the substrate SUB. That is, the substrate SUB having a barrier layer mask BM on the major surface on which the effective portion 106 is formed is introduced into the first chamber 601. In the first chamber 601, the first barrier layer 320 is formed by depositing a metal material through the barrier layer mask BM. In this case, the first barrier layer 320 is formed on the major surface of the substrate SUB so as to include the effective portion 106 throughout a range lager than the effective portion 106.

Figure 13C:
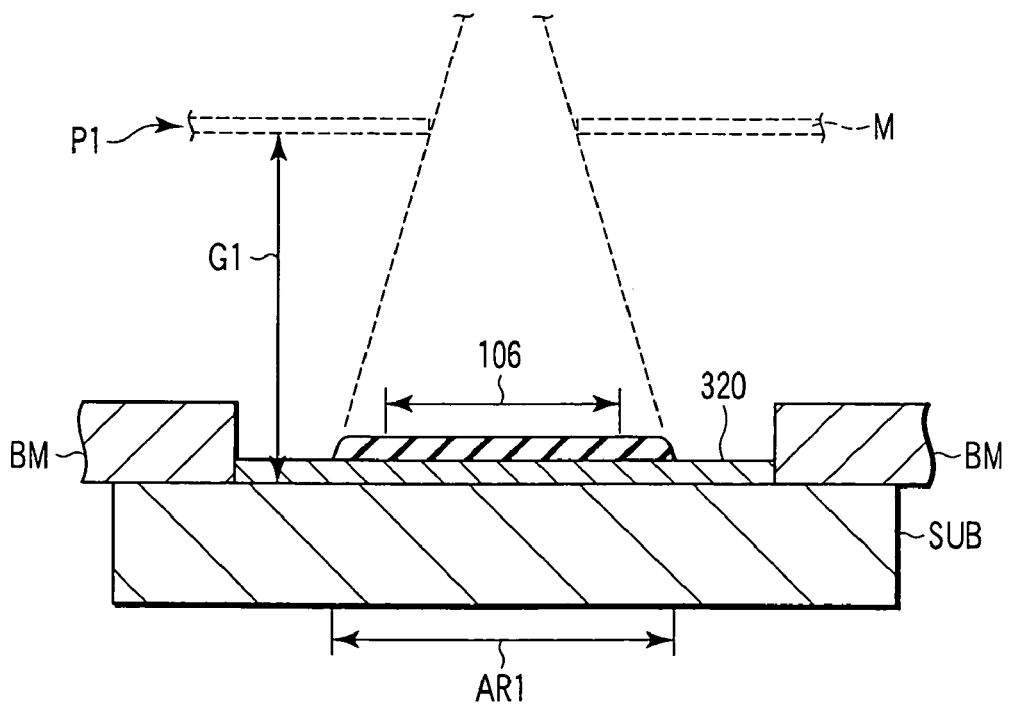
FIG. 13C is a schematic sectional view for explaining a method of manufacturing the first buffer layer of a sealer to be used for the organic EL display device.

Subsequently, as shown in FIG. 13C, the first buffer layer 311 having a pattern larger than at least the effective portion 106 is formed on the first barrier layer 320 in correspondence with the effective portion 106. That is, the substrate SUB having the barrier layer mask BM is introduced into the second chamber 602. In the second chamber 602, the buffer layer mask M is positioned at the first position P1, and the relatively large first gap G1 is formed between the major surface of the substrate SUB and the buffer layer mask M. For example, the liquid monomer of an ultraviolet curing resin material is vaporized as a resin material to form a monomer film in the first area AR1 of the major surface of the substrate through the buffer layer mask M. The first area AR1 is a range smaller than the first barrier layer 320, which is formed immediately below, and includes the effective portion 106 and is larger than the effective portion 106.

The substrate SUB having the barrier layer mask BM is introduced into the third chamber 603. In the third chamber 603, the monomer film formed on the major surface of the substrate SUB is exposed to light having an ultraviolet wavelength at a predetermined exposure amount. As a result, the monomer film is polymerized to be cured to form the first buffer layer 311.

Figure 13D:
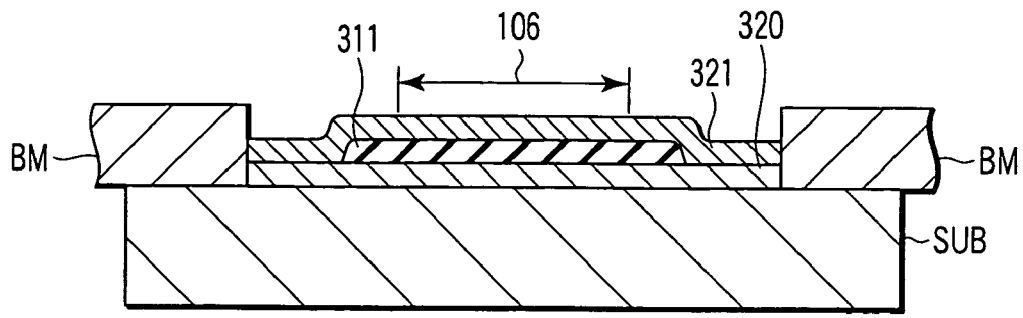
FIG. 13D is a schematic sectional view for explaining a method of manufacturing the second barrier layer of a sealer to be used for the organic EL display device.

As shown in FIG. 13D, like the first barrier layer 320, the second barrier layer 321 which shields the first buffer layer 311 from the open air is formed on the major surface of the substrate SUB in the first chamber 601. The second barrier layer 321 is formed throughout a range larger than the first buffer layer 311 located immediately below the second barrier layer 321. Since the second barrier layer 321 is formed through the barrier layer mask BM mounted on the substrate SUB, this layer is formed as a pattern identical to the first barrier layer 320. With this process, the entire first buffer layer 311 is covered with the second barrier layer 321.

Figure 13E:
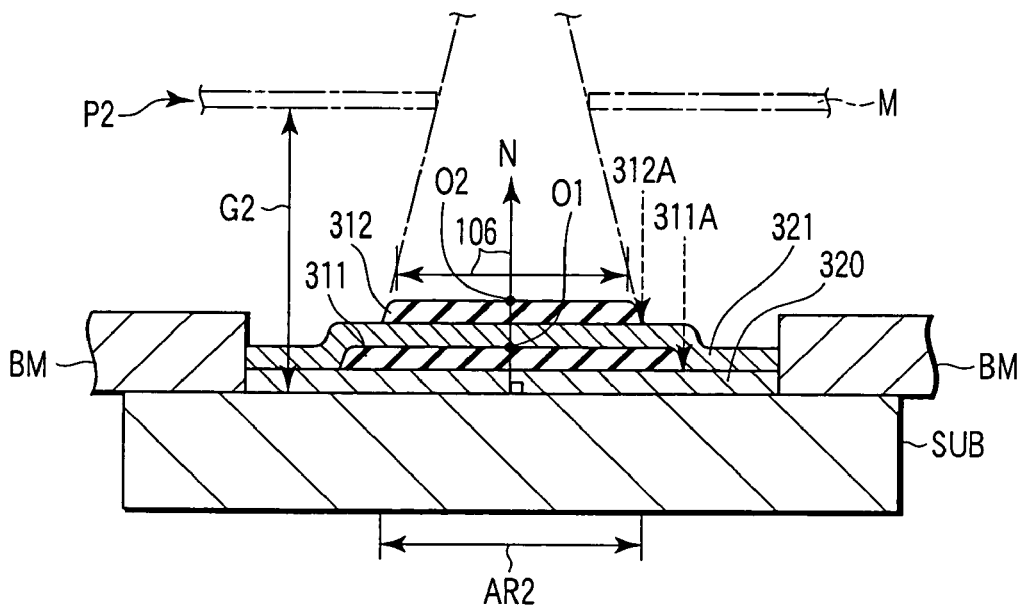
FIG. 13E is a schematic sectional view for explaining a method of manufacturing the second buffer layer of a sealer to be used for the organic EL display device.

As shown in FIG. 13E, the second buffer layer 312 having a pattern larger than at least the effective portion 106 is formed on the second barrier layer 321 in correspondence with the effective portion 106. That is, the substrate SUB having the barrier layer mask BM is introduced into the second chamber 602. In the second chamber 602, the buffer layer mask M is translated from the first position P1 in a direction N of the normal to the major surface of the substrate SUB, and is positioned at the second position P2. As a consequence, the relatively small second gap G2 is formed between the major surface of the substrate SUB and the buffer layer mask M. The liquid monomer of the ultraviolet curing resin material is then vaporized to form a monomer film in the second area AR2 of the major surface of the substrate through the buffer layer mask M. The second area AR2 is a range smaller than the second barrier layer 321 located immediately below the second area AR2, and includes the effective portion 106 and is larger than the effective portion 106.

The substrate SUB having the barrier layer mask BM is introduced into the third chamber 603. In the third chamber 603, the monomer film formed on the major surface of the substrate SUB is exposed to light having an ultraviolet wavelength at a predetermined exposure amount. As a result, the monomer film is polymerized to be cured, thereby forming the second buffer layer 312.

Since the second buffer layer 312 is formed by using the same buffer layer mask M as that used for the formation of the first buffer layer 311, the second buffer layer 312 has a shape similar to that of the first buffer layer 311. In addition, since the second buffer layer 312 is formed while the buffer layer mask M is positioned at the second position P2 translated from the first position P1 in the direction N of the normal to the major surface of the substrate SUB, a center of gravity O2 of the second buffer layer 312 coincides with a center of gravity O1 of the first buffer layer 311 (O2 is located on a normal N to the major surface of the substrate which passes through O1).

The second buffer layer 312 is formed to have a pattern smaller in size than the first buffer layer 311 located below the second buffer layer 312, and is stacked on the first buffer layer 311 such that the outer peripheral portion 312A of the second buffer layer 312 is located inside the outer peripheral portion 311A of the first buffer layer 311 within the major surface of the substrate.

Figure 13F:
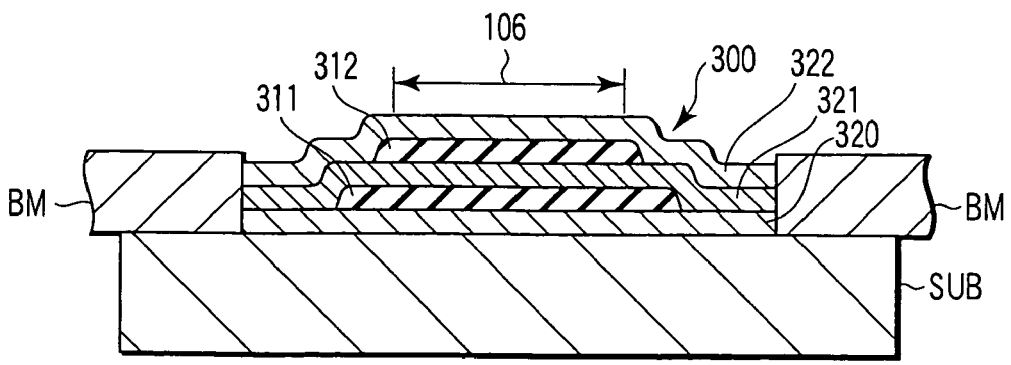
FIG. 13F is a schematic sectional view for explaining a method of manufacturing the third barrier layer of a sealer to be used for the organic EL display device.

As shown in FIG. 13F, like the first barrier layer 320, the third barrier layer 322 which shields the second buffer layer 312 from the open air is formed on the major surface of the substrate SUB in the first chamber 601. The third barrier layer 322 is formed throughout a range larger than the second buffer layer 312 located immediately below the third barrier layer 322. The third barrier layer 322 is formed through the barrier layer mask BM mounted on the substrate SUB, and hence is formed as a pattern identical to the first barrier layer 320 and second barrier layer 321. With this process, the entire second buffer layer 312 is covered with the third barrier layer 322. The sealer 300 having a structure like that shown in FIGS. 11A and 11B is formed through the above processes. After the sealer 300 is formed, the barrier layer mask BM is removed from the substrate SUB.

Subsequently, an adhesive is applied to the surface of the sealer 300, i.e., the entire surface of second barrier layer 321, and a sealing member 200 is bonded thereto. In addition, a polarizing plate may be bonded to the surface from which EL light is to be extracted, as needed.

When a plurality of array portions are formed on a mother substrate, the mother substrate is cut in a unit size for each array portion afterward. With this process, the single array substrate 100 on which the sealer 300 and sealing member 200 are mounted is formed from the substrate SUB. If single array portion is formed on a substrate without using any mother substrate, there is no need to perform the process of cutting a mother substrate in a unit size. In this case, the signal array substrate 100 on which the sealer 300 and sealing member 200 are mounted is directly formed by using the substrate SUB.

According to an organic EL display device 1 manufactured by the above manufacturing process, the organic EL element 40 formed on the effective portion 106 with high robustness against the influences of the lower layers can be reliably covered. Even if a microscopic void is formed in any one of the buffer layers or barrier layers, since a plurality of layers are stacked on each other, the route along which the void reaches the organic EL element 40 becomes long. This provides a sufficient effect of prolonging the service life. Therefore, the organic EL element 40 can be shielded from the open air, and sufficient performance can be maintained for a long period of time. In addition, when the sealing member 200 is to be bonded on the sealer 300 with an adhesive or a polarizing plate is to be bonded on the sealing member 200 with an adhesive, any impurities contained in the adhesive can be prevented from entering the organic EL element 40, thereby preventing a deterioration in the performance of the organic EL element 40.

In addition, the first buffer layer 311 is formed to have a pattern different in size from the second buffer layer 312 placed above the first buffer layer 311, and the second buffer layer 312 is stacked on the first buffer layer 311 such that the outer peripheral portion 312A of the second buffer layer 312 is located inside or outside the outer peripheral portion 311A of the first buffer layer 311 within the major surface of the substrate. Such buffer layers can be formed in the respective film formation processes of forming resin material films through a buffer layer mask with the same pattern by positioning the buffer layer mask such that the gap from the major surface of the substrate to the buffer layer mask is made to vary.

When the second buffer layer 312 has a pattern smaller in size than the first buffer layer 311 located below the second buffer layer 312 as in the sealer 300 shown in FIGS. 11A and 11B, the outer peripheral portion 312A of the second buffer layer 312 is located inside the outer peripheral portion 311A of the first buffer layer 311 within the major surface of the substrate. Such a structure can be formed by setting the gap G2 from the major surface of the substrate SUB to the buffer layer mask M in the film formation process for the formation of the second buffer layer 312 to be smaller than the gap G1 from the major surface of the substrate SUB to the buffer layer mask M in the film formation step for the formation of the first buffer layer 311.

A structure in which the respective buffer layers constituting the sealer 300 gradually decrease in size toward the uppermost layer can be formed by gradually decreasing the gap from the major surface of the substrate to the buffer layer mask in the respective film formation processes for the respective buffer layers (setting the gap between the substrate and the mask in a film formation process for an upper buffer layer to be smaller than that in a film formation process for a lower buffer layer).

When the second buffer layer 312 has a pattern larger in size than the first buffer layer 311 located below the second buffer layer 312 as in the sealer 300 shown in FIGS. 12A and 12B, the outer peripheral portion 312A of the second buffer layer 312 is located outside the outer peripheral portion 311A of the first buffer layer 311 within the major surface of the substrate. Such a structure can be formed by setting the gap G2 from the major surface of the substrate SUB to the buffer layer mask M in the film formation process for the formation of the second buffer layer 312 to be larger than the gap G1 in the film formation process for the formation of the first buffer layer 311.

After the film formation process using the buffer layer mask M positioned to the second position P2 and the curing process, which are performed to form the first buffer layer 311, as shown in FIG. 13E, the film formation process using the buffer layer mask M positioned at the first position P1 and the curing process are performed to form the second buffer layer 312, as shown in FIG. 13C.

That is, a structure in which the respective buffer layers constituting the sealer 300 gradually increase in size toward the uppermost layer can be formed by gradually increasing the gap from the major surface of the substrate to the buffer layer mask in the respective film formation processes for the respective buffer layers (setting the gap between the substrate and the mask in a film formation process for an upper buffer layer to be larger than that in a film formation process for a lower buffer layer).

As described above, according to the fourth embodiment, there is provided an optical device including an almost rectangular effective portion including a plurality of pixels which are formed on the major surface of a substrate to display images, and a sealer which is placed on the major surface of the substrate so as to cover at least the effective portion. In this optical device, the sealer has a structure in which at least two buffer layers and barrier layers each of which is a pattern larger than the buffer layers and covers a corresponding one of the buffer layers are stacked on each other. In addition, the first buffer layer has a pattern different in size from the second buffer layer placed above the first buffer layer, and the second buffer layer is stacked such that its outer peripheral portion is located inside or outside the outer peripheral portion of the first buffer layer within the major surface of the substrate.

With this structure, the display elements formed on the effective portion can be reliably covered. In addition, in the structure in which the buffer layers are stacked on each other so as to have patterns gradually decreasing in size toward the uppermost layer, with their outer peripheral portions being shifted from each other, the periphery of the sealer can be formed into a moderately inclined surface. This allows the barrier layers to reliably cover the overall buffer layers including their outer peripheral portions, thus preventing the occurrence of a coverage failure. In the structure in which the buffer layers are stacked on each other so as to have patterns gradually increasing in size toward the uppermost layer, with their outer peripheral portions being shifted from each other, since each upper buffer layer is placed to cover a corresponding lower buffer layer, the sealing performance of the sealer can be improved. This makes it possible to ensure high shielding performance against external impurities and the open air, which can in turn maintain good display performance for a long period of time.

In the fourth embodiment described above, in the second chamber, the buffer layer mask is moved in the direction of the normal to the major surface of the substrate to change the gap from the major surface of the substrate to the buffer layer mask. However, the present invention is not limited to this. For example, the substrate may be moved in the direction of the normal to change the gap to the buffer layer mask, or both the substrate and the buffer layer mask may be moved in the direction of the normal to the substrate.

In the second chamber, in order to change the gap from the major surface of the substrate to the buffer layer mask, at least one of the buffer layer mask and the substrate is moved in the direction of the normal to the substrate so as to be positioned to a predetermined position. However, in order to accurately control the gap between the major surface of the substrate and the buffer layer mask, a spacer having a predetermined height may be inserted between them.

The fourth embodiment has exemplified the case wherein the sealer is comprised of two buffer layers and three barrier layers (FIGS. 11A and 12A). However, the combination of the numbers of layers is not limited to this. Note that if a sealer is to be formed by stacking 10 or more thin layers, the productivity decreases due to an excessive number of steps. For this reason, the number of thin layers to be stacked is set to two or more and less than 10, and preferably three to five.

According to the first to fourth embodiments described above, a display element which has excellent sealing characteristics and can maintain good display performance, an optical device, and an optical device manufacturing method can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic electroluminescence (EL) display device comprising:
    an array substrate including an effective portion on which an organic EL element is formed; and
    a sealer including
    a first barrier layer which covers the organic EL element formed on the effective portion, is formed over a range larger than the effective portion and includes an upper surface,
    a first buffer layer which is disposed above the upper surface of the first barrier layer, partially covers the first barrier layer and includes an upper surface and an outer end portion,
    a second barrier layer which covers the upper surface and the outer end portion of the first buffer layer, adheres to the first barrier layer at a periphery of the first buffer layer and includes an upper surface,
    a second buffer layer which is disposed above the upper surface of the second barrier layer, partially covers the second barrier layer and includes an upper surface and an outer end portion, and
    a third barrier layer which covers the upper surface and the outer end portion of the second buffer layer and adheres to the second barrier layer at a periphery of the second buffer layer, the outer end portion of the second buffer layer being located in a position different from a position right above the outer end portion of the first buffer layer.

2. An organic EL display device according to claim 1, wherein the second buffer layer is a pattern smaller than the first s t buffer layer, and the outer end portion of the second buffer layer is located in a position inward of the position right above the outer end portion of the first buffer layer.

3. An organic EL display device according to claim 1, wherein the second buffer layer is a pattern larger than the first buffer layer, and the outer end portion of the second buffer layer is located in a position outward of the position right above the outer end portion of the first buffer layer.

4. An organic EL display device according to claim 1, wherein the first, second and third barrier layers are formed by using one material selected from a group consisting of a metal material, a metal oxide material and a ceramic-based material.

5. An organic EL display device according to claim 1, wherein the first and second buffer layers are formed by using a resin material.

* * * * *